(12) United States Patent
Kim et al.

(10) Patent No.: US 12,494,173 B2
(45) Date of Patent: Dec. 9, 2025

(54) DISPLAY DEVICE COMPRISING SUB-PIXELS FOR CONTROLLING VIEWING ANGLE

(71) Applicant: LG Display Co., Ltd., Seoul (KR)

(72) Inventors: Haksu Kim, Paju-si (KR); Yoonji Choi, Paju-si (KR); Hongman Moon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/922,829

(22) Filed: Oct. 22, 2024

(65) Prior Publication Data

US 2025/0131882 A1 Apr. 24, 2025

(30) Foreign Application Priority Data

Oct. 23, 2023 (KR) .................. 10-2023-0142313

(51) Int. Cl.
*G09G 3/32* (2016.01)
*G02F 1/1368* (2006.01)
*G09G 3/3233* (2016.01)
*H10K 59/80* (2023.01)

(52) U.S. Cl.
CPC ......... *G09G 3/3233* (2013.01); *G02F 1/1368* (2013.01); *H10K 59/879* (2023.02); *G09G 2300/0819* (2013.01); *G09G 2300/0842* (2013.01); *G09G 2300/0861* (2013.01); *G09G 2310/08* (2013.01); *G09G 2320/068* (2013.01); *G09G 2358/00* (2013.01)

(58) Field of Classification Search
CPC .............................................. G09G 3/30–3291
See application file for complete search history.

(56) References Cited

U.S. PATENT DOCUMENTS

| 2017/0345371 | A1* | 11/2017 | Son | G09G 3/3258 |
| 2022/0399529 | A1* | 12/2022 | Shin | G09G 3/3275 |
| 2024/0161674 | A1* | 5/2024 | Choi | G09G 3/32 |

FOREIGN PATENT DOCUMENTS

| KR | 10-2022-0165958 A | 12/2022 |
| KR | 10-2498276 B1 | 2/2023 |

* cited by examiner

*Primary Examiner* — Roy P Rabindranath
(74) *Attorney, Agent, or Firm* — Morgan, Lewis & Bockius LLP

(57) ABSTRACT

A display device may include sub-pixels, each sub-pixel including: a first mode sub-pixel having a first viewing angle and including a first emitting element; a second mode sub-pixel having a second viewing angle and including a second emitting element; a driving transistor; a first emitting control line supplying a first emitting control signal; a second emitting control line supplying a second emitting control signal; a first switching transistor supplying a reference voltage to a storage capacitor by being controlled by the first emitting control signal; a second switching transistor supplying a reference voltage to a storage capacitor by being controlled by the second emitting control signal; a first control transistor connecting the first emitting element and the driving transistor by being controlled by the first emitting control signal; and a second control transistor connecting the second emitting element and the driving transistor controlled by the second emitting control signal.

12 Claims, 15 Drawing Sheets

DISPLAY DEVICE COMPRISING SUB-PIXELS FOR CONTROLLING VIEWING ANGLE

CROSS-REFERENCE TO RELATED APPLICATIONS

This application claims the benefit of and priority to Korean Patent Applications No. 10-2023-0142313 filed on Oct. 23, 2023, the entire contents of which are incorporated herein by reference for all purposes.

BACKGROUND

1. Technical Field

The present disclosure relates to an apparatus, and particularly to, for example, without limitation, a display device capable of controlling one or more viewing angles.

2. Discussion of the Related Art

Recently, there has been a problem of information leakage to third parties through image information displayed on a display device. To solve this problem, security films are being developed to provide image information only to specific people located in front of the display device.

By attaching a security film to the display device, the user can prevent a nearby third party from viewing the image information displayed on the display device, and by removing the security film from the display device, the user can show the image information displayed on the display device to a nearby third party. The user has inconvenience of having to store and manage these security films separately.

The description of the related art should not be assumed to be prior art merely because it is mentioned in or associated with this section. The description of the related art includes information that describes one or more aspects of the subject technology, and the description in this section does not limit the invention.

SUMMARY

One or more aspects of the present disclosure are to provide a display device capable of controlling a viewing angle without a security film.

One or more aspects of the present disclosure are to provide a display device capable of minimizing the increase in width of a bezel area.

One or more aspects of the present disclosure are to provide a display device capable of implementing Environmental/Social/Governance (ESG) by reducing the generation of greenhouse gases that can be generated by a manufacturing process.

The technical benefits of the present disclosure are not limited to the above-mentioned benefits, and other benefits, which are not mentioned above, can be clearly understood by those skilled in the art from the present disclosure.

A display device according to an example embodiment of the present disclosure includes a display panel having a non-display area and a display area provided with a plurality of sub-pixels, wherein each of the plurality of sub-pixels includes: a first mode sub-pixel having a first viewing angle and including a first emitting element; a second mode sub-pixel having a second viewing angle and including a second emitting element; a driving transistor connected to the first emitting element or the second emitting element; a first emitting control line for supplying a first emitting control signal; a second emitting control line for supplying a second emitting control signal; a first switching transistor for supplying a reference voltage to a storage capacitor by being controlled by the first emitting control signal; a second switching transistor for supplying a reference voltage to a storage capacitor by being controlled by the second emitting control signal; a first control transistor for connecting the first emitting element and the driving transistor by being controlled by the first emitting control signal; and a second control transistor for connecting the second emitting element and the driving transistor controlled by the second emitting control signal.

Additional features, advantages, and aspects of the present disclosure are set forth in part in the description that follows and in part will become apparent from the present disclosure or may be learned by practice of the inventive concepts provided herein. Other features, advantages, and aspects of the present disclosure may be realized and attained by the descriptions provided in the present disclosure, or derivable therefrom, and the claims hereof as well as the drawings. It is intended that all such features, advantages, and aspects be included within this description, be within the scope of the present disclosure, and be protected by the following claims. Nothing in this section should be taken as a limitation on those claims. Further aspects and advantages are discussed below in conjunction with embodiments of the present disclosure.

It is to be understood that both the foregoing description and the following description of the present disclosure are examples, and are intended to provide further explanation of the disclosure as claimed.

BRIEF DESCRIPTION OF THE DRAWINGS

The accompanying drawings, which are included to provide a further understanding of the present disclosure, are incorporated in and constitute a part of this present disclosure, illustrate aspects and embodiments of the present disclosure, and together with the description serve to explain principles and examples of the disclosure.

Figure 1:
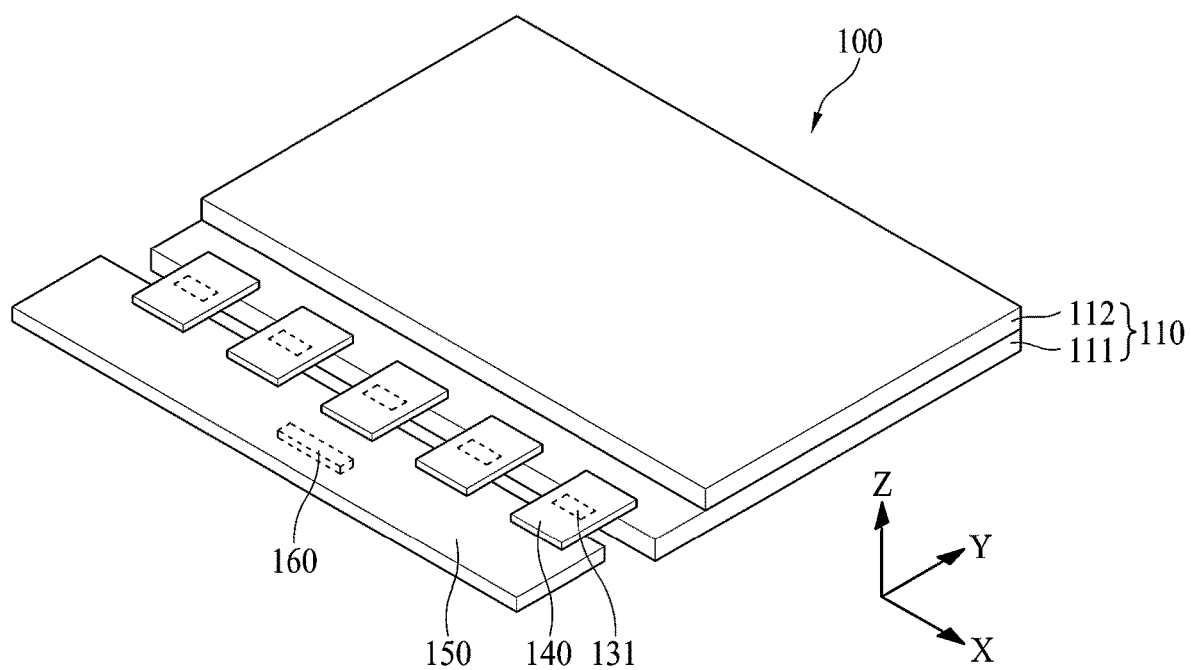
FIG. 1 is a perspective view illustrating a display device according to one example embodiment.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Reference is now made in detail to embodiments of the present disclosure, examples of which may be illustrated in the accompanying drawings. In the following description, when a detailed description of well-known methods, functions, structures or configurations may unnecessarily obscure aspects of the present disclosure, the detailed description thereof may have been omitted for brevity. Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. Unless stated otherwise, the same reference numerals may be used to refer to the same or substantially the same elements throughout the specification and the drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

Shapes, dimensions (e.g., sizes, lengths, widths, heights, thicknesses, locations, radii, diameters, and areas), proportions, ratios, angles, numbers, the number of elements, and the like disclosed herein, including those illustrated in the drawings, are merely examples, and thus, the present disclosure is not limited to the illustrated details. It is, however, noted that the relative dimensions of the components illustrated in the drawings are part of the present disclosure.

When the term "comprise," "have," "include," "contain," "constitute," "made of," "formed of," "composed of," or the like is used with respect to one or more elements (e.g., layers, films, components, sections, members, parts, regions, areas, portions, steps, operations, and/or the like), one or more other elements may be added unless a term such as "only" or the like is used. The terms used in the present disclosure are merely used in order to describe particular example embodiments, and are not intended to limit the scope of the present disclosure. The terms of a singular form may include plural forms unless the context clearly indicates otherwise. For example, an element may be one or more elements. An element may include a plurality of elements. The word "exemplary" is used to mean serving as an example or illustration. Embodiments are example embodiments. Aspects are example aspects. In one or more implementations, "embodiments," "examples," "aspects," and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

In one or more aspects, unless explicitly stated otherwise, an element, feature, or corresponding information (e.g., a level, range, dimension, size, or the like) is construed to include an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

When a positional relationship between two elements (e.g., layers, films, components, sections, members, parts, regions, areas, portions, and/or the like) are described using any of the terms such as "on," "on a top of," "upon," "on top of," "over," "under," "above," "upper," "at an upper portion," "at a upper side," "below," "lower," "at a lower portion," "at a lower side," "beneath," "near," "close to," "adjacent to," "beside," "next to," "at or on a side of," and/or the like indicating a position or location, one or more other elements may be located between the two elements unless a more limiting term, such as "immediate(ly)," "direct(ly)," or "close(ly)," is used. For example, when an element and another element are described using any of the foregoing terms, this description should be construed as including a case in which the elements contact each other directly as well as a case in which one or more additional elements are disposed or interposed therebetween. Furthermore, the spatially relative terms such as the foregoing terms as well as other terms such as "front," "rear," "back," "left," "right," "top," "bottom," "upper," "lower," "downward," "upward," "up," "down," "column," "row," "vertical," "horizontal," "diagonal," and the like refer to an arbitrary frame of reference. For example, these terms may be used for an example understanding of a relative relationship between elements, including any correlation as shown in the drawings. However, embodiments of the disclosure are not limited thereby or thereto. The spatially relative terms are to be understood as terms including different orientations of the elements in use or in operation in addition to the orientation depicted in the drawings or described herein. For example, where a lower element or an element positioned under another element is overturned, then the element may be termed as an upper element or an element positioned above another element. Thus, for example, the term "under" or "beneath" may encompass, in meaning, the term "above" or "over." An example term "below" or the like, can include all directions, including directions of "below," "above" and diagonal directions. Likewise, an example term "above," "on" or the like can include all directions, including directions of "above," "on," "below" and diagonal directions.

In describing a temporal relationship, when the temporal order is described as, for example, "after," "following," "subsequent," "next," "before," "preceding," "prior to," or the like, a case that is not consecutive or not sequential may be included and thus one or more other events may occur therebetween, unless a more limiting term, such as "just," "immediate(ly)," or "direct(ly)," is used.

It is understood that, although the terms "first," "second," and the like may be used herein to describe various elements (e.g., layers, films, components, sections, members, parts, regions, areas, portions, steps, operations, and/or the like), these elements should not be limited by these terms, for example, to any particular order, precedence, or number of elements. These terms are used only to distinguish one element from another. For example, a first element may denote a second element, and, similarly, a second element may denote a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element, and the like) are not limited by ordinal numbers or the names in front of the elements. Further, a first element may include one or more first elements. Similarly, a second element or the like may include one or more second elements or the like.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

The expression that an element (e.g., layer, film, component, lens, electrode, filter, section, member, part, region, area, portion, or the like) "is engaged" with another element may be understood, for example, as that the element may be either directly or indirectly engaged with the another element. The term "is engaged" or similar expressions may refer to a term such as "covers," "surrounds," "is in contact," "overlaps," "crosses," "intersects," "is connected," "is coupled," "is attached," "is adhered," "is combined," "is linked," "is provided," "is disposed," "interacts," or the like. The engagement may involve one or more intervening elements disposed or interposed between the element and the another element, unless otherwise specified. Further, the element may be engaged at least partially or entirely (or completely) with the another element, unless otherwise specified. Further, the element may be included in at least one of two or more elements that are engaged with each other. Similarly, the another element may be included in at least one of two or more elements that are engaged with each other. When the element is engaged with the another element, at least a portion of the element may be engaged with at least a portion of the another element. The term "with another element" or similar expressions may be understood as "another element," or "with, to, in, or on another element," as appropriate by the context. Similarly, the term "with each other" may be understood as "each other," or "with, to, or on each other," as appropriate by the context.

The phrase "through" may be understood, for example, to be at least partially through or entirely through.

The terms such as a "line" or "direction" should not be interpreted only based on a geometrical relationship in which the respective lines or directions are parallel, perpendicular, diagonal, or slanted with respect to each other, and may be meant as lines or directions having wider directivities within the range within which the components of the present disclosure may operate functionally.

The term "at least one" should be understood as including any and all combinations of one or more of the associated listed items. For example, each of the phrases "at least one of a first item, a second item, or a third item" and "at least one of a first item, a second item, and a third item" may represent (i) a combination of items provided by two or more of the first item, the second item, and the third item or (ii) only one of the first item, the second item, or the third item. Further, at least one of a plurality of elements can represent (i) one element of the plurality of elements, (ii) some elements of the plurality of elements, or (iii) all elements of the plurality of elements. Further, "at least some," "some," "some elements," "a portion," "portions," "at least a portion," "at least portions," "a part," "at least a part," "parts," "at least parts," "one or more," or the like of the plurality of elements can represent (i) one element of the plurality of elements, (ii) a part of the plurality of elements, (iii) parts of the plurality of elements, (iv) multiple elements of the plurality of elements, or (v) all of the plurality of elements. Moreover, "at least some portions," "some," "at least some parts," "a portion," "portions," "at least a portion," "at least portions," "a part," "at least a part," "parts," "at least parts," or the like of an element can represent (i) a portion (or a part) of the element, (ii) one or more portions (or parts) of the element, or (iii) the element, or all portions of the element.

The expression of a first element, a second elements "and/or" a third element should be understood as one of the first, second and third elements or as any or all combinations of the first, second and third elements. By way of example, A, B and/or C may refer to only A; only B; only C; any of A, B, and C (e.g., A, B, or C); some combination of A, B, and C (e.g., A and B; A and C; or B and C); or all of A, B, and C. Furthermore, an expression "A/B" may be understood as A and/or B. For example, an expression "A/B" may refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element is referred to as being "between" at least two elements, the element may be the only element between the at least two elements, or one or more intervening elements may also be present.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

The term "or" means "inclusive or" rather than "exclusive or." That is, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

A phrase "substantially the same" or "nearly the same" may indicate a degree of being considered as being equivalent to each other taking into account minute differences due to errors in the manufacturing process.

Features of various embodiments of the present disclosure may be partially or entirely coupled to or combined with each other, may be technically associated with each other, and may be variously operated, linked or driven together in various ways. Embodiments of the present disclosure may be implemented or carried out independently of each other or may be implemented or carried out together in a co-dependent or related relationship. In one or more aspects, the components of each apparatus and device according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein. For example, the term "part" or "unit" may apply, for example, to a separate circuit, component or structure, an integrated circuit, a computational block of a circuit device, or a structure configured to perform a described function as should be understood by one of ordinary skill in the art.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example embodiments.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

In description of flow of a signal, for example, when a signal is provided from a node A to a node B, this may include a case where the signal is transferred from the node A to the node B via one or more nodes unless a phrase such as "immediately transferred," "directly transferred" or the like is used.

In the following description, various example embodiments of the present disclosure are described in more detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

Figure 2:
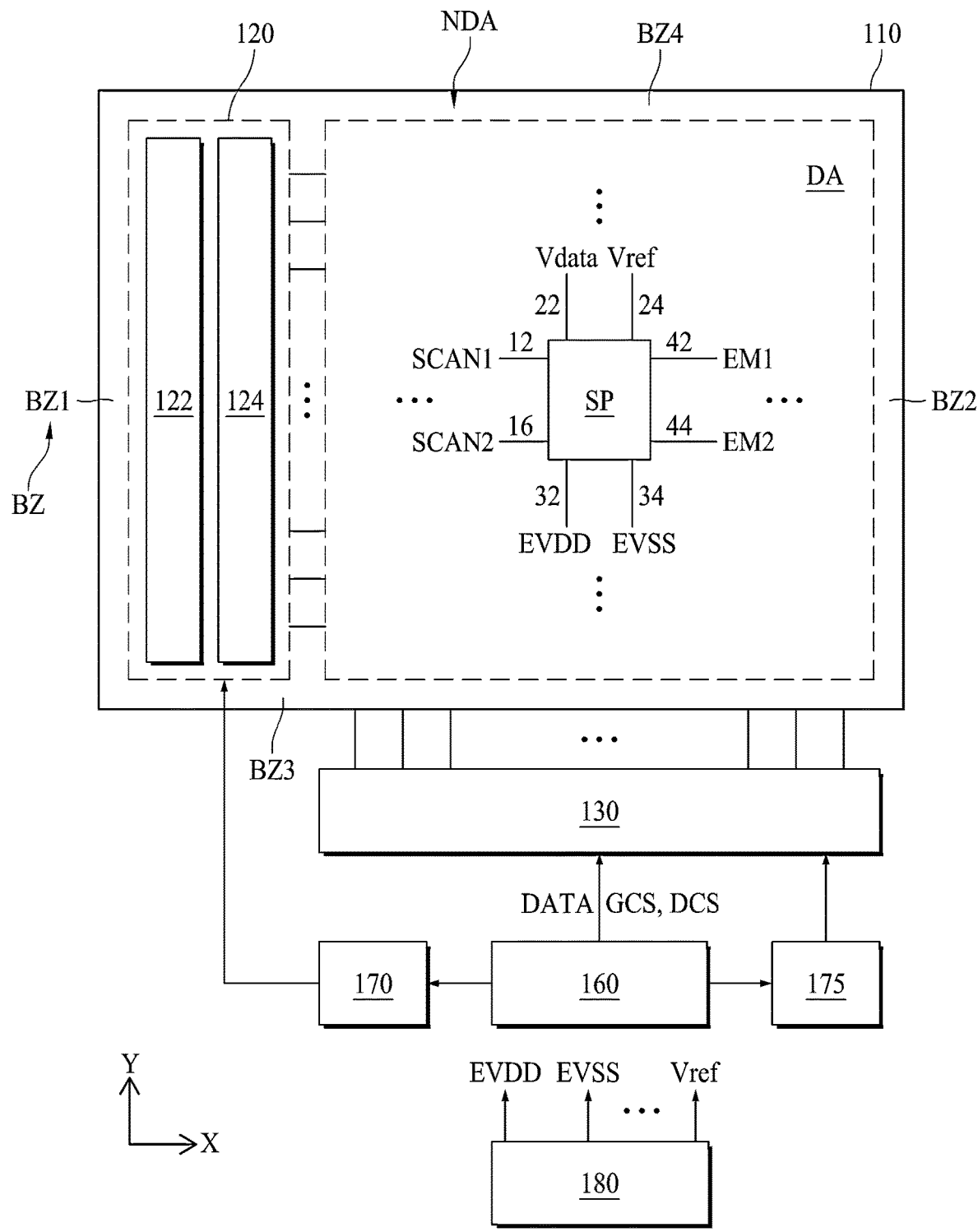
FIG. 2 is a block diagram schematically illustrating a configuration of a display device, according to one example embodiment.
Figure 3:
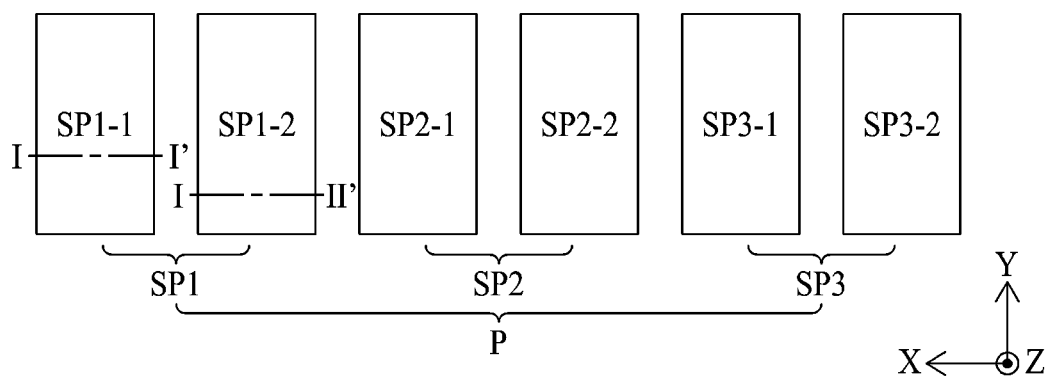
FIG. 3 is a plan view illustrating an example of a pixel in a display device according to one example embodiment.

FIG. 1 is a perspective view illustrating a display device according to one example embodiment and FIG. 2 is a block diagram schematically illustrating a configuration of a display device, according to one example embodiment. FIG. 3 is a plan view illustrating an example of a pixel in a display device according to one example embodiment.

While the display device 100 according to one example embodiment has been described with emphasis on its implementation as an Organic Light Emitting Display, it can also be implemented as a Liquid Crystal Display, Quantum dot Lighting Emitting Diode, or Electrophoresis display.

Referring to FIGS. 1 and 2, the display device 100 according to one example embodiment includes a display panel 110, a gate driver 120 embedded in the display panel 110, a data driver 130 connected to the display panel 110, a timing controller 160 controlling the gate driver 120 and the data driver 130, a gamma voltage generator 175, and a power circuit 180. In one example embodiment, the display device 100 can further include a level shifter 170 connecting between the timing controller 160 and the gate driver 120. In one example embodiment, the data driver 130, the timing controller 160, the gamma voltage generator 175, and the level shifter 170 can be integrated into a display driver.

The display panel 110 includes a first substrate 111 and a second substrate 112. The second substrate 112 can be an encapsulation substrate. The first substrate 111 can be a plastic film or a glass substrate, but is not necessarily limited to. The first substrate 111 can also be made of a semiconductor material, such as a silicon wafer. The second substrate 112 can be a plastic film, a glass substrate, or an encapsulation film (or protective film).

The display device 100 according to one example embodiment can emit light in a so-called top emission type in which the emitted light is emitted upwardly but is not necessarily limited thereto. When the display device 100 emits light in a top emission type, the material of the first substrate 111 can include an opaque material as well as a transparent material. When the display device 100 emits light in a bottom emission type in which the emitted light is emitted downwardly, the material of the first substrate 111 can include a transparent material. Hereinafter, for convenience of explanation, the following description assumes that the display device 100 emits light in the top emission type, but is not necessarily limited thereto.

The display panel 110 includes a display area DA and a bezel area BZ. The bezel area BZ is surrounding the display area DA and disposed at a periphery. The display panel 110 displays images in the display area DA with a plurality of sub-pixels SP disposed in a matrix type. The plurality of sub-pixels SPs can include a plurality of row lines including sub-pixels SPs disposed in a first direction (e.g., X-axis direction) and a plurality of column lines including sub-pixels SPs disposed in a second direction (e.g., Y-axis direction).

Each of the sub-pixels SPs, as shown in FIG. 3, can be one of a first sub-pixel SP1 emitting red light, a second sub-pixel SP2 emitting green light, and a third sub-pixel SP3 emitting blue light, but not necessarily limited to. The unit pixel P can include at least two or more sub-pixels SPs. In one example, the unit pixel P can include the first sub-pixel SP1, the second sub-pixel SP2, and the third sub-pixel SP3, as shown in FIG. 3. The unit pixel P can further include a fourth sub-pixel that emits white light. Further, the arrangement order of the sub-pixels SP1, SP2, and SP3 can be varied.

The display panel 110 can include a plurality of signal lines including data lines 22, gate lines 12, 16, 42, and 44, and power lines 24, 32, and 34 connected to each of the sub-pixels SPs.

The data lines 22 can be disposed to extend in the second direction (e.g., in the Y-axis direction) to supply each sub-pixel SP with a data voltage Vdata supplied from the data driver 130.

The gate lines 12, 16, 42, and 44 are disposed to intersect with the data lines 22 so that signals supplied from the gate driver 120 can be supplied to each sub-pixel SP. Specifically, some of the gate lines 12, 16, 42, and 44 (12 and 16, referred to herein as "scan lines") can supply scan signals SCAN1 and SCAN2 supplied from the scan driver 122 to each sub-pixel SP. Other portions of the gate lines 12, 16, 42, and 44 (42 and 44, referred to herein as "emitting control lines") can supply emitting control signals EM1 and EM2 supplied from the emitting control driver 124 to each sub-pixel SP. The first emitting control line 42 among the emitting control lines 42 and 44 can supply a first emitting control signal EM1 for driving a first emitting element to each sub-pixel SP. The second emitting control line 44 among the emitting control lines 42 and 44 can supply a second emitting control signal EM2 for driving a second emitting element to each sub-pixel SP. In this example, the first emitting element and the second emitting element can have different viewing angles. By selectively driving the first emitting element and the second emitting element of each sub-pixel SP using the first and second emitting control signals EM1 and EM2, the display device 100 can control the viewing angle of each sub-pixel SP. A detailed description of this will be described later.

The initialization voltage line 24 among the power lines 24, 32, and 34 can supply an initialization voltage Vref supplied from the power circuit 180 to each sub-pixel SP. The first power line 32 can supply a first power voltage (or high potential power voltage) EVDD to each sub-pixel SP. The second power line 34 can supply a second power voltage (or low potential power voltage) EVSS to each sub-pixel SP through a common electrode (or cathode electrode).

The gate driver 120 can be disposed in at least one of the plurality of bezel areas BZ1 to BZ2 disposed in the periphery of the display area DA. For example, the gate driver 120 can be disposed in any one of the first and second bezel areas BZ1 and BZ2 facing each other across the display area DA, or can be disposed on both sides of the first and second bezel areas BZ1 and BZ2. The gate driver 120 can be disposed in a Gate In Panel (GIP) type, which is composed of transistors formed in the same process as the transistors disposed in the display area DA.

The gate driver 120 can include a scan driver 122 that drives a plurality of gate lines 12 and 16 connected to the sub-pixels SPs of each row line. The gate driver 120 can further include an emitting control driver 124 that drives a plurality of emitting control lines 42 and 44 connected to the sub-pixels SPs of each row line.

Each of the scan driver 122 and the emitting control driver 124 can be supplied with a plurality of gate control signals supplied through the level shifter 170 from the timing controller 160 to operate. In one example embodiment, each of the scan driver 122 and the emitting control driver 124 can be supplied with the plurality of gate control signals from the timing controller 160.

The level shifter 170 can be supplied with control signals from the timing controller 160. The level shifter 170 shifts level of the control signals and performs logic process for the control signals to generate the plurality of gate control signals GCS, and supply the plurality of gate control signals GSC to the scan driver 122 and the emitting control driver 124.

The scan driver 122 can supply at least one scan signal SCAN1 and SCAN2 to each of the plurality of row lines using the gate control signal GCS supplied from the level shifter 170 or the timing controller 160. The scan driver 122 can supply the scan signals SCAN1 and SCAN2 to the plurality of scan lines 12 and 16 connected to the sub-pixels SP of each row line.

The emitting control driver 124 can supply the emitting control signals EM1 and EM2 to each of the plurality of row lines using the gate control signal GCS supplied from the level shifter 170 or the timing controller 160. The emitting control driver 124 can supply the emitting control signals EM1 and EM2 to the emitting control lines 42 and 44 connected to the sub-pixels SP of each of the row lines.

The gamma voltage generator 175 can generate a plurality of reference gamma voltages having different voltage levels and supply them to the data driver 130. The gamma voltage generator 175 can generate and supply the plurality of reference gamma voltages corresponding to a gamma characteristic of the display device to the data driver 130 under control of the timing controller 160. In one example embodiment, the gamma voltage generator 175 can adjust the levels of the reference gamma voltages according to a gamma data supplied from the timing controller 160 and output them to the data driver 130.

The data driver 130 receives digital video data DATA and a data control signal DCS from the timing controller 160. The data driver 130 converts the digital video data DATA to analog positive/negative data voltages Vdata using the data control signals DCS and supplies them to the data lines 22.

The data driver 130 can include a plurality of data drive ICs 131 as shown in FIG. 1. Each of the plurality of data drive ICs 131 can be mounted on a circuit film 140 in a chip on film COF, chip on plastic COP, flexible printed circuit FPC, or flexible flat cable FFC manner. The circuit film 140 is attached to pads disposed in the non-display area NDA of the display panel 110 using an anisotropic conducting film, such that the plurality of data drive ICs 131 can be connected to the pads.

The circuit board 150 can be attached to the circuit film 140. In the circuit board 150, a plurality of circuits implemented as driving chips can be mounted. For example, in the circuit board 150, a timing controller 160 can be mounted. The circuit board 150 can be a printed circuit board or a flexible printed circuit board.

The timing controller 160 receives digital video data DATA and timing signals from the host system. The timing signals can include a vertical synchronization signal, a horizontal synchronization signal, a data enable signal, a dot clock, and the like. The vertical synchronization signal is a signal that defines the duration of one frame. A horizontal synchronization signal is a signal that defines a period of one horizontal period required to supply data voltages to the pixels of one horizontal line of the display panel DIS. The Data Enable signal defines the period in which valid data is input. The dot clock is a signal that repeats at a predetermined short interval.

The timing controller 160 generates the data control signal DCS for controlling the timing of operation of the data driver 130 and the gate control signal GCS for controlling the timing of operation of the gate driver 120 based on the timing signals. The timing controller 160 supplies the gate control signal GCS to the gate driver 120, and supplies the digital video data DATA and the data control signal DCS to the data driver 130. The timing controller 160, according to one example embodiment, can generate and supply control signals for timing control to the level shifter 170 to allow that the level shifter 170 generates and supplies the plurality of gate control signals GCS to the gate driver 120.

The power circuit 180 can generate and supply a plurality of drive voltages required for operation of all circuit configurations of the display device 100 using utilize the input voltage. The power circuit 180 can generate and supply a first power voltage EVDD, a second power voltage EVSS, and the initialization voltage Vref (or a reference voltage) to the display panel 110. The power circuit 180 can generate and supply various drive voltages required for operation of the gate driver 200, the data driver 300, the timing controller 400, and the viewing angle control circuit 170.

Figure 4:
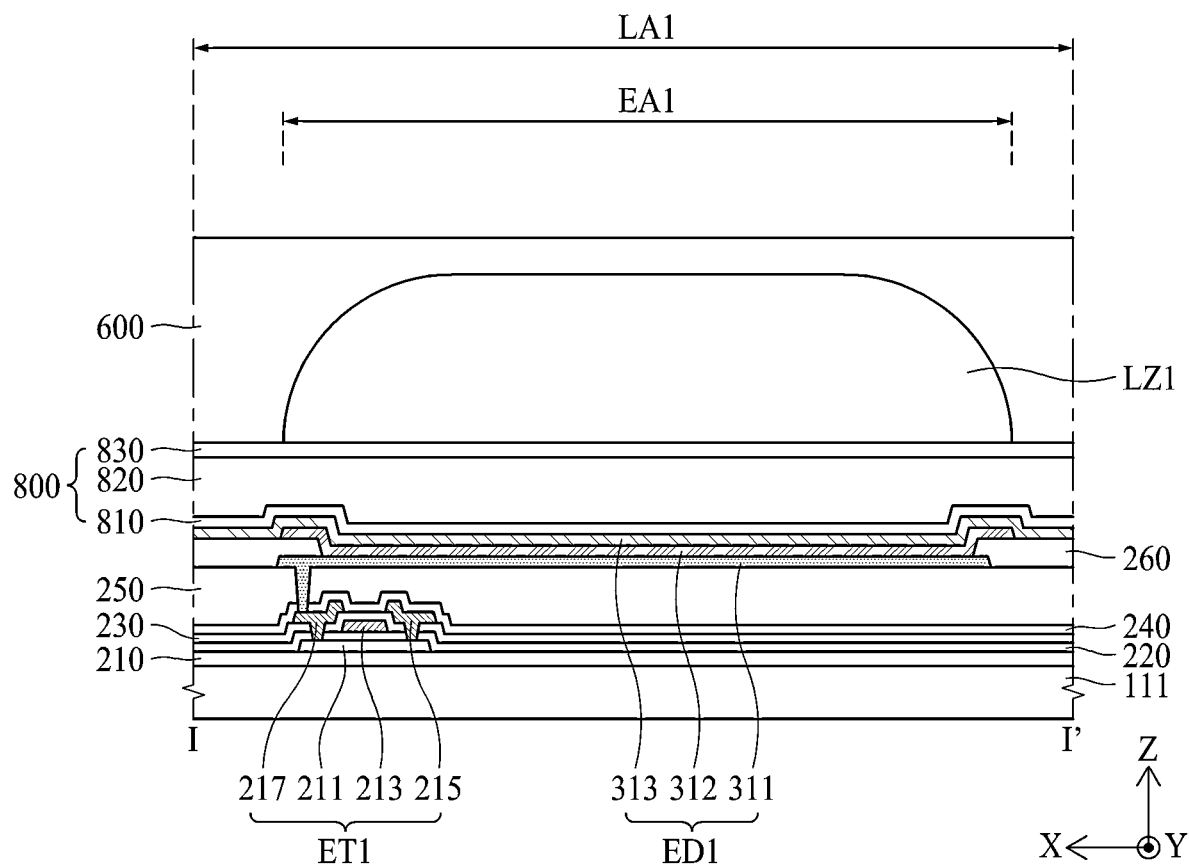
FIG. 4 is a cross-sectional view illustrating an example of a first mode sub-pixel according to I-I' shown in FIG. 3.
Figure 5:
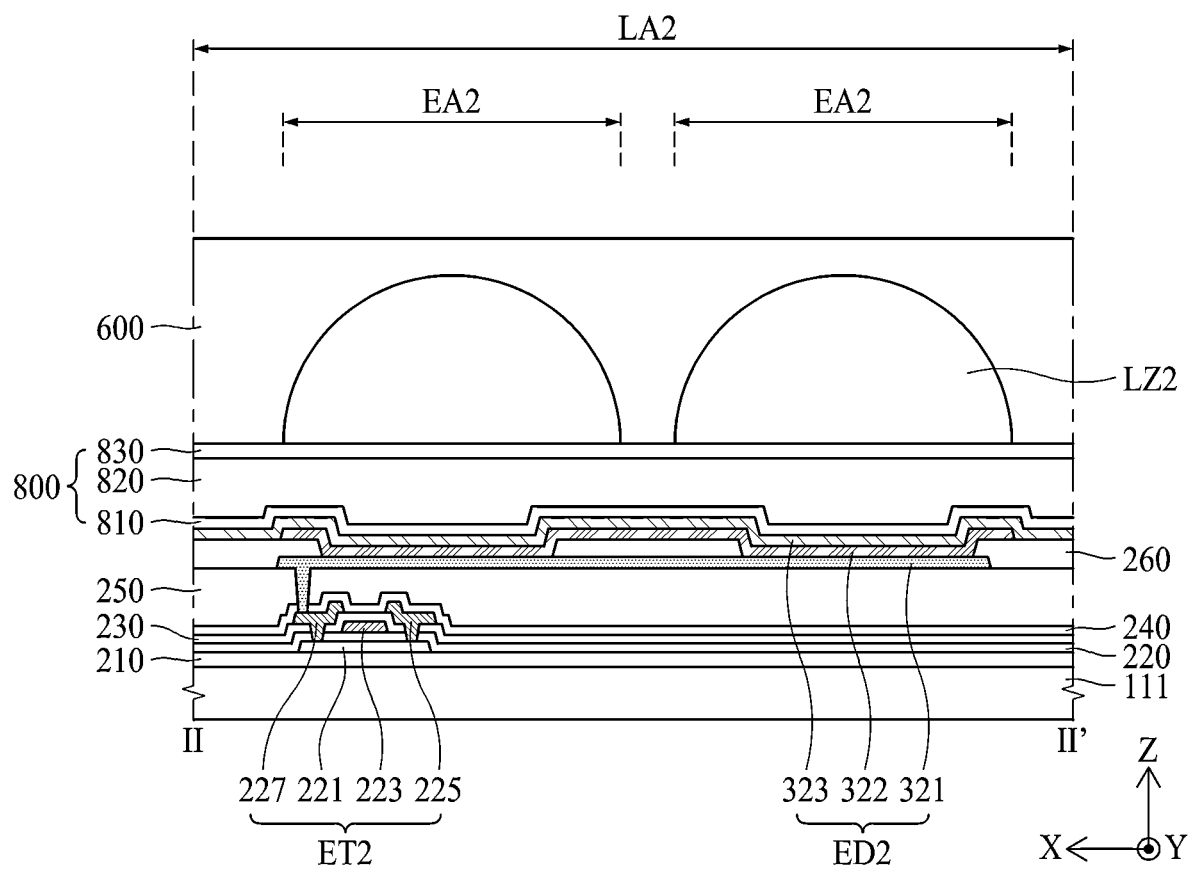
FIG. 5 is a cross-sectional view illustrating an example of a second mode sub-pixel according to II-II' shown in FIG. 3.

FIG. 4 is a cross-sectional view illustrating an example of a first mode sub-pixel according to I-I' shown in FIG. 3, and FIG. 5 is a cross-sectional view illustrating an example of a second mode sub-pixel according to II-II' shown in FIG. 3.

The display panel 110 according to one example embodiment can control the viewing angle of each sub-pixel SP using emitting control signals EM1 and EM2 supplied through emitting control lines 42 and 44. Specifically, each sub-pixel SP can include two or more mode sub-pixels with different viewing angles. For example, each of the sub-pixels SP1, SP2, and SP3 illustrated in FIG. 3 can include a first mode sub-pixel SP1-1, SP2-1, and SP3-1 and a second mode sub-pixel SP1-2, SP2-2, and SP3-2. The first mode sub-pixels SP1-1, SP2-1, and SP3-1 can have a first viewing angle and include the first emitting element. The second mode sub-pixels SP1-2, SP2-2, and SP3-2 can have a second viewing angle and include the second emitting element. The first viewing angle and the second viewing angle can be different in at least one of a direction and an angular range. In one example, the second viewing angle can have a smaller angular range than the first viewing angle. As another example, the first viewing angle can be 60 degrees to the left from a frontal 0 degree, and the second viewing angle can be 60 degrees to the right from the frontal 0 degree.

Each sub-pixel SP1, SP2, and SP3 can selectively drive one of the first emitting element and the second emitting element to control a viewing angle. In one example, each sub-pixel SP1, SP2, and SP3 can implement a first viewing angle mode by driving the first emitting element of the first mode sub-pixel SP1-1, SP2-1, and SP3-1. In one example embodiment, the first viewing angle mode can be a wide viewing angle mode or a share mode. In another example, each sub-pixel SP1, SP2, and SP3 can implement the second viewing angle mode by driving the second emitting element of the second mode sub-pixel SP1-2, SP2-2, and SP3-2. In one example embodiment, the second viewing angle mode can be a narrow viewing angle mode or a privacy mode that limits the angular range of the viewing angle to a smaller extent than the first viewing angle mode.

There are various ways to implement different viewing angles of the first mode sub-pixels SP1-1, SP2-1, and SP3-1 and the second mode sub-pixels SP1-2, SP2-2, and SP3-2. In one example, the first mode sub-pixels SP1-1, SP2-1, and SP3-1 and the second mode sub-pixels SP1-2, SP2-2, and SP3-2 with different viewing angles can be implemented using the lenses LZ1 and LZ2 as shown in FIGS. 4 and 5.

A display panel 110 according to one example embodiment includes the first substrate 111 as shown in FIGS. 4 and 5, a circuit element layer including transistors ET1 and ET2 disposed on the first substrate 111, an emitting element layer including emitting elements ED1 and ED2 disposed on the circuit element layer, an encapsulation layer 800 disposed on the emitting element layer, and a lens layer including lenses LZ1 and LZ2 disposed on the encapsulation layer 800. The display panel 110 according to one example embodiment can further include a touch sensor layer disposed between the encapsulation layer 800 and the lens layer. The display panel 110 according to one example embodiment can further include a color filter layer comprising a color filter and a black matrix disposed between the touch sensor layer and the lens layer.

Each sub-pixel SP1, SP2, and SP3 can include a first lens area LA1 shown in FIG. 4, and a second lens area LA2 shown in FIG. 5.

Referring to FIG. 4, the first lens area LA1 can include a first control transistor ET1 of the pixel circuit, a first emitting element ED1 connected to the first control transistor ET1, and a first lens LZ1 disposed to overlap the first light emitting area EA1 on the first emitting element ED1.

Referring to FIG. 5, the second lens area LA2 can include a second control transistor ET2 of the pixel circuit, a second emitting element ED2 connected to the second control transistor ET2, and a plurality of second lenses LZ2 disposed to overlap a plurality of second light emitting areas EA2 on the second emitting element ED2, respectively.

In the display panel 110 according to one example embodiment, the circuit element layer disposed on the first substrate 110 can include a plurality of insulating layers stacked on the first substrate 110. For example, the plurality of insulating layers can include a buffer layer 210, a gate insulating layer 220, an interlayer insulating layer 230, a protection layer 240, and a planarization layer 250.

The first substrate 111 can include an insulating material, such as glass or plastic. The plastic substrate can be formed of a flexible material. For example, the first substrate 111 can include an organic insulating material of at least one of an acrylic-based resin, an epoxy-based resin, a siloxane-based resin, a polyimide-based resin, and a polyamide-based resin.

The buffer layer 210 can have a single-layer or multi-layer structure comprising an inorganic insulating material such as silicon oxide SiOx, silicon nitride SiNx, or aluminum oxide Al2O3. The buffer layer 210 can prevent hydrogen from flowing into the semiconductor layers 211 and 221 through the first substrate 110.

The control transistors ET1 and ET2 can be disposed on the buffer layer 210.

The first control transistor ET1 includes a semiconductor layer 211, a gate electrode 213, a source electrode 215, and a drain electrode 217 disposed on the buffer layer 210. The second control transistor ET2 includes a semiconductor layer 221, a gate electrode 223, a source electrode 225, and a drain electrode 227 disposed on the buffer layer 210. A gate insulating layer 110 can be disposed between the semiconductor layers 211 and 221 and the gate electrodes 213 and 223. An interlayer insulating layer 230 can be disposed between the gate electrodes 213 and 223 and the source and drain electrodes 215, 217, 225, and 227. Each of the source electrode 215 and the drain electrode 217 of the first control transistor ET1 can be connected with the source area and the drain area of the semiconductor layer 211, respectively, through each contact holes penetrating the interlayer insulating layer 230 and the gate insulating layer 110. Each of the source electrode 225 and the drain electrode 227 of the second control transistor ET2 can be connected with the source area and the drain area of the semiconductor layer 221, respectively, through each contact holes penetrating the interlayer insulating layer 230 and the gate insulating layer 110.

The semiconductor layers 211 and 221 can include polycrystalline silicon, or can comprise an oxide semiconductor material. The semiconductor layers 211 and 221 can include low temperature polysilicon LPTS. The semiconductor layers 211 and 221 can include an oxide semiconductor material of at least one of IZO series (InZnO), IGO series (InGaO), ITO series (InSnO), IGZO series (InGaZnO), IGZTO series (InGaZnSnO), GZTO series (GaZnSnO), GZO series (GaZnO), and ITZO series (InSnZnO). A light blocking layer can further be disposed below the semiconductor layers 211 and 221.

The gate insulating layer 220 can include an inorganic insulating material such as silicon oxide SiOx and silicon nitride SiNx. The gate insulating layer 220 can include a material having a high dielectric constant. For example, the gate insulating layer 220 can include a high-K material such as hafnium oxide HfO. The gate insulating layer 220 can have a multi-layer structure.

The Gate lines connected with the gate electrodes 213 and 223 can be disposed on the gate insulating layer 220.

The interlayer insulating layer 230 can include an inorganic insulating material such as silicon oxide SiOx and silicon nitride SiNx. The interlayer insulating layer 230 can have a multi-layer structure.

Data lines and power lines connected to the source electrodes 215 and 225 or the drain electrodes 217 and 227 can be disposed on the interlayer insulating layer 230.

A protection layer 240 and a planarization layer 250 can be stacked on the first and second control transistors ET1 and ET2. The protection layer 240 can include an inorganic insulating material such as silicon oxide SiOx and silicon nitride SiNx. The planarization layer 250 can include an organic insulating material different from the protection layer 240 and provide a planar surface.

The emitting element layer including the first emitting element ED1 and the second emitting element ED2 can be disposed on the planarization layer 250.

The first emitting element ED1 includes a first electrode 311 disposed on the planarization layer 250, a light emitting layer 312 disposed on the first electrode 311, and a second electrode 313 disposed on the light emitting layer 312. The second emitting element ED2 includes a first electrode 321 disposed on the planarization layer 250, a light emitting layer 322 disposed on the first electrode 321, and a second electrode 323 disposed on the light emitting layer 322. The first emitting element ED1 and the second emitting element ED2 disposed in each sub-pixel SP1, SP2, and SP3 can emit light of the same color.

The first electrode 311 of the first emitting element ED1 can be connected to any one of the source electrode 215 and the drain electrode 217 of the first control transistor ET1 through the contact hole penetrating the protection layer 240 and the planarization layer 250. The first electrode 321 of the second emitting element ED2 can be connected with any one of the source electrode 225 and the drain electrode 227 of the second control transistor ET2 through the contact hole penetrating the protection layer 240 and the planarization layer 250.

The first electrodes 311 and 321 can include a conductive material having a high reflectivity. The first electrodes 311 and 321 can include metals such as aluminum Al, silver Ag, titanium Ti, and silver-palladium-copper APC alloys. The first electrodes 311 and 321 can further comprise a transparent conductive material such as indium tin oxide ITO or indium zinc oxide IZO. For example, the first electrodes 311 and 321 can have a multilayer structure (Ti/Al/Ti) of titanium Ti and aluminum Al, a multilayer structure (ITO/Al/ITO) of a multilayer structure of ITO and aluminum Al, or a multilayer structure (ITO/APC/ITO) of ITO and APC.

The light emitting layers 312 and 322 can include an emission material layer EML including an emissive material. The emission material can include an organic material, an inorganic material, or a hybrid material. The light emitting layer 312 of the first emitting element ED1 and the second light emitting layer 322 of the second emitting element ED2 can be spaced apart. Accordingly, light emission by a leakage current can be prevented.

The light emitting layers 312 and 322 can have a multilayer structure. For example, the light emitting layers 312 and 322 can include at least one of a hole injection layer HIL, a hole transport layer HTL, an electron transport layer ETL, and an electron injection layer EIL.

The second electrodes 313 and 323 can include a light-transmissive conductive material. The second electrodes 313 and 323 can include a transparent conductive material such as ITO or IZO. The second electrodes 313 and 323 can include aluminum Al, magnesium Mg, silver Ag, or an alloy thereof, and can have a thin thickness that is light transmissive. Accordingly, light generated by each of the light emitting layers 312 and 322 can be emitted through each of the second electrodes 313 and 323.

The first electrode 311 of the first emitting element ED1 can be spaced apart from the first electrode 321 of the second emitting element ED2, and a bank 160 can be disposed between the first electrodes 311 and 321. The bank 260 can cover an edge of each of the first electrodes 311 and 321. The bank 260 can include an organic insulating material. The bank 260 can include a different organic material from the planarization layer 250, and can have a single- or double-layer structure.

The bank 260 can define the first emission area EA1 by having an opening through which the first electrode 311 is exposed. The light emitting layer 312 and the second electrode 313 of the first emitting element ED1 can be stacked on the first electrode 311 exposed by the opening of the bank 260.

The bank 260 can define a second emission area EA2 by having an opening through which the first electrode 321 of the second emitting element ED2 is exposed. In one example embodiment, the bank 260 can define a plurality of second emission areas EA2 by having a plurality of openings on the first electrode 321 of the second emitting element ED2. The light emitting layer 322 and the second electrode 323 of the second emitting element ED2 can be stacked on the first electrode 321 exposed by the openings of the bank 260. The emitting layer 322 and second electrode 323 of the second emitting element ED2 can overlap the first electrode 321 with the bank 260 interposed therebetween. In the second lens area BNE, a plurality of second emitting areas EA2 can be spaced apart by the bank 260 and disposed independently, but can share the first electrode 321, the light emitting layer 322, and the second electrode 323 of the second emitting element ED2. Accordingly, the light emission efficiency of the second light emitting area EA2 can be improved. The size of the second light-emitting area EA2 can be smaller than the size of the first light-emitting area EA1.

The second electrode 313 of the first emitting element ED1 can be a common electrode electrically connected with the second electrode 323 of the second emitting element ED2.

The encapsulation layer 800 can be disposed on the emitting element layer including the first emitting element ED1 and the second emitting element ED2. The encapsulation layer 800 can prevent damage to the emitting elements ED1 and ED2 by moisture and impact from the outside. The encapsulation layer 800 can have a multi-layer structure. For example, the encapsulation layer 800 can include, but is not limited to, a first encapsulation layer 810, a second encapsulation layer 820, and a third encapsulation layer 830 stacked in sequence. The first encapsulation layer 810, the second encapsulation layer 820, and the third encapsulation layer 830 can include an insulating material. The second encapsulation layer 820 can include a different material from the first encapsulation layer 810 and the third encapsulation layer 830. For example, the first encapsulation layer 810 and the third encapsulation layer 830 can be inorganic encapsulation layers including an inorganic insulating material, and the second encapsulation layer 820 can include an organic encapsulation layer including an organic insulating material. Accordingly, the emitting elements ED1 and ED2 can be more effectively prevented from being damaged by moisture and impact from the outside.

The lens layer including a first lens LZ1 and a second lens LZ2 can be disposed on the encapsulation layer 800.

The first lens LZ1 is disposed on the first emitting element ED1 of the first mode sub-pixel SP1-1, SP2-1, and SP3-1, and can be disposed on the optical progression path of the first emitting element (ED1). The second lens LZ2 is disposed on the second emitting element ED2 of the second mode sub-pixel SP1-2, SP2-2, and SP3-2, and can be disposed on the optical progression path of the second emitting element ED2.

In each of the sub-pixels SP1, SP2, and SP3, the second emitting element ED2 can include a plurality of second emitting elements ED2 or the plurality of second emitting areas EA2, and the plurality of second lenses LZ2 can be individually disposed on the plurality of second emitting elements ED2 or the plurality of second emitting areas EA2. In each of the sub-pixels SP1, SP2, and SP3, the plurality of second emitting elements ED2 or the plurality of second emitting areas EA2 can be connected in parallel.

The first lens LZ1 and the second lens LZ2 can differently control (limit) a viewing angle in at least one direction. In one example, the first lens LZ1 and the second lens LZ2 can control (limit) the viewing angle in the first direction (e.g., the X-axis direction) differently and control (limit) the viewing angle in the second direction (e.g., the Y-axis direction) the same.

For example, the first lens LZ1 does not limit the progression path of light emitted from the first emitting element ED1 to within a certain angle in the first direction (e.g., the X-axis direction), thereby controlling the viewing angle to a wide field of view. The second lens LZ2 can control the viewing angle to a narrow field of view by limiting the progression path of the light emitted from the second emitting element ED2 to within a certain angle in the first direction (e.g., the X-axis direction).

When the first emitting element ED1 is driven in each of the sub-pixels SP1, SP2, and SP3, the corresponding sub-pixel can operate in the wide viewing angle mode that does not limit the viewing angle in the first direction (e.g., the X-axis direction). When the second emitting element ED2 is driven in each of the sub-pixels SP1, SP2, and SP3, the corresponding sub-pixel can operate in a narrow viewing angle mode that limits the viewing angle in the first direction (e.g., the X-axis direction).

That is, each sub-pixel SP1, SP2, and SP3 can drive a first emitting element ED1 to implement the first viewing angle mode, the wide viewing angle mode, or a share mode through the first lens area LA1. Each of the sub-pixels SP1, SP2, and SP3 can drive the second emitting element ED2 to implement the second viewing angle mode, a narrow viewing angle mode, or a privacy mode that implement a viewing angle different from the first viewing angle mode through the second lens area LA2.

A lens protection layer 600 can be disposed on the first lens LZ1 and the second lens LZ2 of each sub-pixel SP1, SP2, and SP3. The lens protection layer 600 can include an organic insulating material. The refractive index of the lens protection layer 600 can be smaller than the refractive index of the first lens LZ1 and the refractive index of the second lens LZ2. Accordingly, light passing through the first lens LZ1 and the second lens LZ2 cannot be reflected in the direction of the first substrate 110 due to the difference in refractive indices with the lens protection layer 600.

Figure 6:
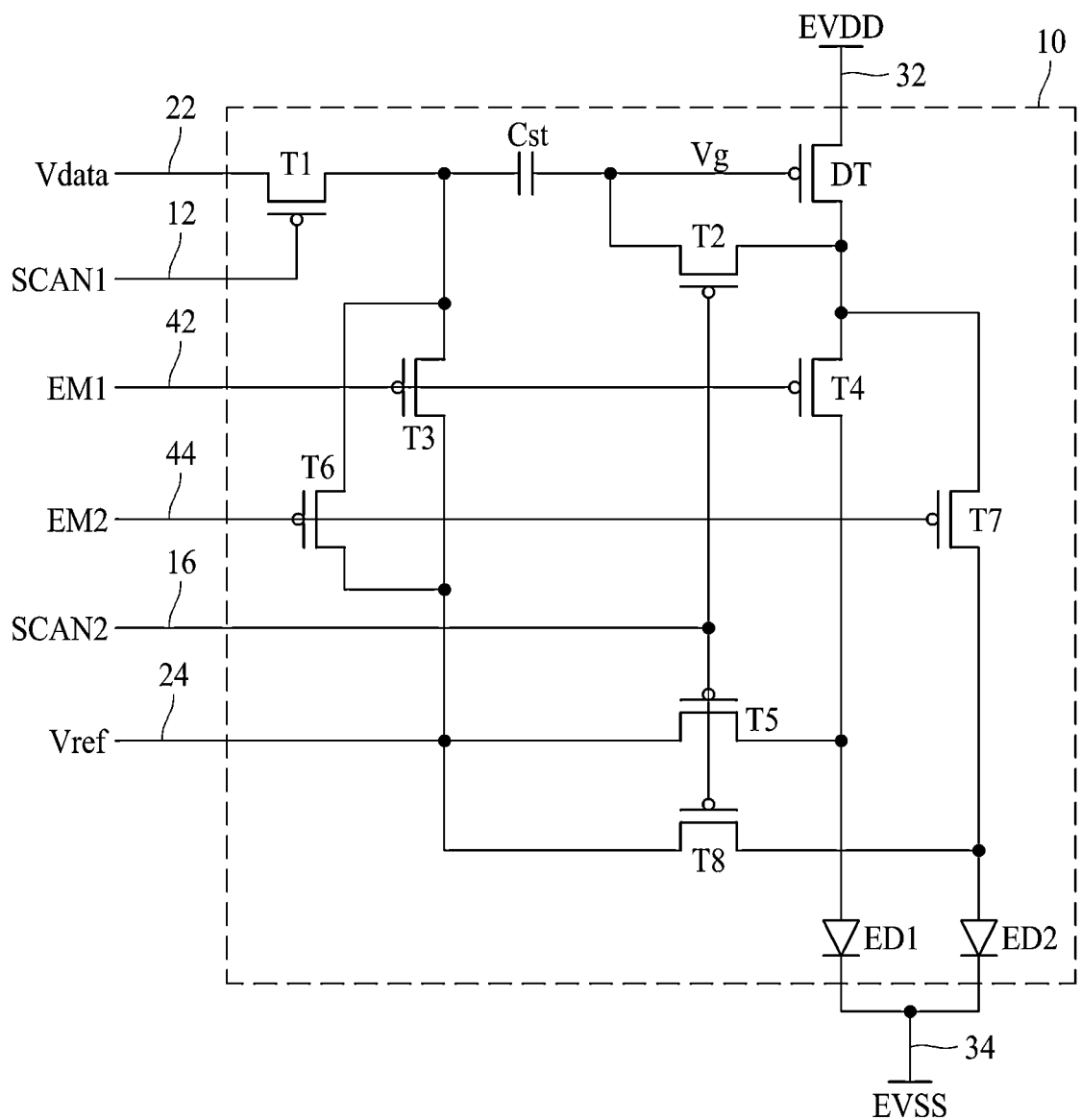
FIG. 6 is an equivalent circuit diagram illustrating a circuit configuration of each sub-pixel in a display panel, according to one example embodiment.

FIG. 6 is an equivalent circuit diagram illustrating a circuit configuration of each sub-pixel in a display panel, according to one example embodiment.

Referring to FIG. 6, each sub-pixel SP can include a pixel circuit 10 including a plurality of transistors DT and T1 to T8 and the first and second emitting elements ED1 and ED2.

The pixel circuit 10 illustrated in FIG. 6 can include eight switching transistors T1 to T8, a driving transistor DT, a storage capacitor Cst, and the first and second emitting elements ED1 and ED2. In FIG. 6, the fourth switching transistor T4 can be represented as a first control transistor, and can correspond to the first control transistor ET1 shown in FIG. 4. Further, the seventh switching transistor T7 can be expressed as a second control transistor, and can correspond to the second control transistor ET2 shown in FIG. 5

Each of the transistors DT and T1 to T8 of each sub-pixel SP includes a gate electrode, a source electrode, and a drain electrode. Since the source electrode and the drain electrode are not fixed and can be changed according to the direction of the voltage and current applied to the gate electrode, one of the source electrode and the drain electrode can be represented as a first electrode, and the other can be represented as a second electrode. The transistors DT and T1 to T8 of each sub-pixel SP can utilize at least one of a polysilicon semiconductor, an amorphous silicon semiconductor, and an oxide semiconductor. The transistors can be P-type or N-type, or a mixture of P-type and N-type.

The first electrode of the driving transistor DT can be connected to a first power line 32 that supplies the first power voltage EVDD. The first power voltage EVDD can be supplied from the power circuit 180. The second electrode of the driving transistor DT can be in common connection with the first electrodes of the first and second control transistors T4 and T7. The driving transistor DT can drive the first emitting element ED1 through the first control transistor T4, or can drive the second emitting element ED2 through the second control transistor T7. The driving transistor DT can control the driving current according to the driving voltage Vg of the storage capacitor Cst. Thereby, the driving transistor DT can control the emission intensity of the first emitting element ED1 through the first control transistor T4, or can control the emission intensity of the second emitting element ED2 through the second control transistor T7.

The storage capacitor Cst can charge a drive voltage Vg corresponding to the data voltage Vdata. The storage capacitor Cst can supply the charged driving voltage Vg to the driving transistor DT.

The first switching transistor T1 can be turned on or turned off in response to a first scan signal SCAN1 supplied to the first scan line 22. The first switching transistor T1 can supply the data voltage Vdata supplied through the data line 22 to the first electrode of the storage capacitor Cst in response to the gate-on-voltage VON of the first scan signal SCAN1. The first scan signal SCAN1 can be supplied from the scan driver 122 shown in FIG. 2.

The second, fifth, and eighth switching transistors T2, T5, and T8 can be turned on or off in response to a second scan signal SCAN2 supplied to the second scan line 16. The second scan signal SCAN2 can be supplied from the scan driver 122 shown in FIG. 2.

The second switching transistor T2 can connect the driving transistor DT as a diode structure by connecting the gate electrode and the second electrode of the driving transistor DT in response to the gate-on-voltage VON of the second scan signal SCAN2. The second switching transistor T2 can charge and compensate the threshold voltage Vth of the driving transistor DT to the storage capacitor Cst. Accordingly, the storage capacitor Cst can charge a data voltage Vdata+Vth with which the threshold voltage Vth of the driving transistor DT is compensated.

The fifth switching transistor T5 can supply the initialization voltage Vref (or reference voltage) supplied through the initialization voltage line 24 in response to the gate-on-voltage VON of the second scan signal SCAN2 to the anode electrode of the first emitting element ED1.

The eighth switching transistor T8 can supply an initialization voltage Vref (or reference voltage) supplied through the initialization voltage line 24 in response to the gate-on-voltage VON of the second scan signal SCAN2 to the anode electrode of the second emitting element ED2.

The third switching transistor T3 can be turned on or turned off in response to a first emitting control signal EM1 supplied to the first emitting control line 42. The first emitting control signal EM1 can be supplied from the emitting control driver 124 shown in FIG. 2.

The third switching transistor T3 can supply the initialization voltage Vref (or reference voltage) supplied through the initialization voltage line 24 to the first electrode of the storage capacitor Cst in response to the gate-on-voltage VON of the first emitting control signal EM1.

The sixth switching transistor T6 can be turned on or turned off in response to a second emitting control signal EM2 supplied to the second emitting control line 44. The second emitting control signal EM2 can be supplied from the emitting control driver 124 shown in FIG. 2.

The sixth switching transistor T6 can supply the initialization voltage Vref (or reference voltage) supplied through the initialization voltage line 24 to the first electrode of the storage capacitor Cst in response to the gate-on-voltage VON of the second emitting control signal EM2.

The first control transistor T4 can be turned on or off by being controlled by the first emitting control signal EM1 supplied to the first emitting control line 42, and the second control transistor T7 can be turned on or off by being controlled by the second emitting control signal EM2 supplied to the second emitting control line 44.

The first control transistor T4 can be turned on when the first emitting control signal EM1 is at the gate-on-voltage VON, thereby connecting the driving transistor DT and the first emitting element ED1. Accordingly, the first emitting element ED1 can be driven by the driving current from the driving transistor DT to emit light. The sub-pixels SP1, SP2, and SP3 can emit light at the first viewing angle through the first lens LZ1, and can operate in the first viewing angle mode, the wide viewing angle mode, or the share mode.

The second control transistor T7 can be turned on when the second emitting control signal EM2 is at the gate-on-voltage VON, thereby connecting the driving transistor DT and the second emitting element ED2. Accordingly, the second emitting element ED2 can be driven by the driving current from the driving transistor DT to emit light. The sub-pixels SP1, SP2, and SP3 can emit light at the second viewing angle through the second lens LZ2, and can operate in the second viewing angle mode, the narrow viewing angle mode, or the privacy mode.

Each of the emitting elements ED1 and ED2 can include an anode electrode individually connected to each of the control transistors T4 and T7, a cathode electrode receiving a second power voltage EVSS from the second power line 34, and a light emitting layer between the anode electrode and the cathode electrode. The anode electrode can be an independent electrode for each emitting element, while the cathode electrode can be a common electrode shared by all emitting elements. When a driving current is supplied from the driving transistor DT through each of the control transistors T4 and T7, in each of the emitting elements ED1 and ED2, electrons from the cathode electrodes are injected into the light emitting layer, and holes from the anode electrodes are injected into the light emitting layer, and the fluorescent or phosphorescent material can be emitted by the recombination of the electrons and holes in the light emitting layer, thereby generating light with a brightness proportional to the current value of the driving current.

The first emitting element ED1 can be driven using the first control transistor T4 controlled by the first emitting control signal EM1. Specifically, the first emitting element ED1 can be driven in connection with the driving transistor DT when the first control transistor T4 is turned on by the first emitting control signal EM1 corresponding to the gate-on-voltage VON. The first lens LZ1 disposed in the light propagation direction of the first emitting element ED1 can control the viewing angle to the first viewing angle.

The second emitting element ED2 can be driven using the second control transistor T7 controlled by the second emitting control signal EM2. Specifically, the second emitting element ED2 can be driven in connection with the driving transistor DT when the second control transistor T7 is turned on by the second emitting control signal EM2 corresponding to the gate-on-voltage VON. The second lens LZ2 disposed in the light propagation direction of the second emitting element ED2 can be controlled at the second viewing angle.

The display panel 110 according to one example embodiment can select the mode of each of the sub-pixels SP1, SP2, and SP3 between the first viewing angle mode and the second viewing angle mode using the first and second emitting control signals EM1 and EM2. Each of the sub-pixels SP1, SP2, and SP3 provided in the display panel 110 according to an example embodiment includes the first mode sub-pixel SP1-1, SP2-1, and SP3-1 having the first viewing angle and provided with the first emitting element ED1, and the second mode sub-pixel SP1-2, SP2-2, and SP3-2 having the second viewing angle and provided with a second emitting element ED2.

Each sub-pixel SP1, SP2, and SP3 is capable of emitting only one of the first emitting element ED1 and the second emitting element ED2 using the emitting control signals EM1 and EM2 applied through the emitting control lines 42 and 44. In each sub-pixel SP1, SP2, and SP3, when the first control transistor T4 connected with the first emitting element ED1 is turned on by the first emitting control signal EM1, the first emitting element ED1 and the driving transistor DT are connected so that the first emitting element ED1 can emit. Meanwhile, in each sub-pixel SP1, SP2, and SP3, when the second control transistor T7 connected with the second emitting element ED2 is turned on by the second emitting control signal EM2, the second emitting element ED2 and the driving transistor DT are connected so that the second emitting element ED2 can emit. In the display panel 110 according to one example embodiment, only one of the first emitting element ED1 and the second emitting element ED2 can emit light by supplying a gate-on-voltage VON to one of the first emitting control signal EM1 and the second emitting control signal EM2 and supplying a gate-off-voltage VOFF to the other.

The first emitting element ED1 and the second emitting element ED2 provided in the same sub-pixel SP cannot emit simultaneously. The first emitting control signal EM1 can be activated with the gate-on-voltage VON when controlling the corresponding sub-pixel to the first viewing angle mode, the wide viewing angle mode, or the share mode, and deactivated with the gate-off-voltage VOFF when controlling the corresponding sub-pixel to the second viewing angle mode, the narrow viewing angle mode, or the privacy mode. On the other hand, the second emitting control signal EM2 can be activated with the gate-on-voltage VON when controlling the corresponding sub-pixel to the second viewing angle mode, the narrow viewing angle mode, or the privacy mode, and deactivated with the gate-off-voltage VOFF when controlling the corresponding sub-pixel to the first viewing angle mode, the wide viewing angle mode, or the share mode.

Figure 7:
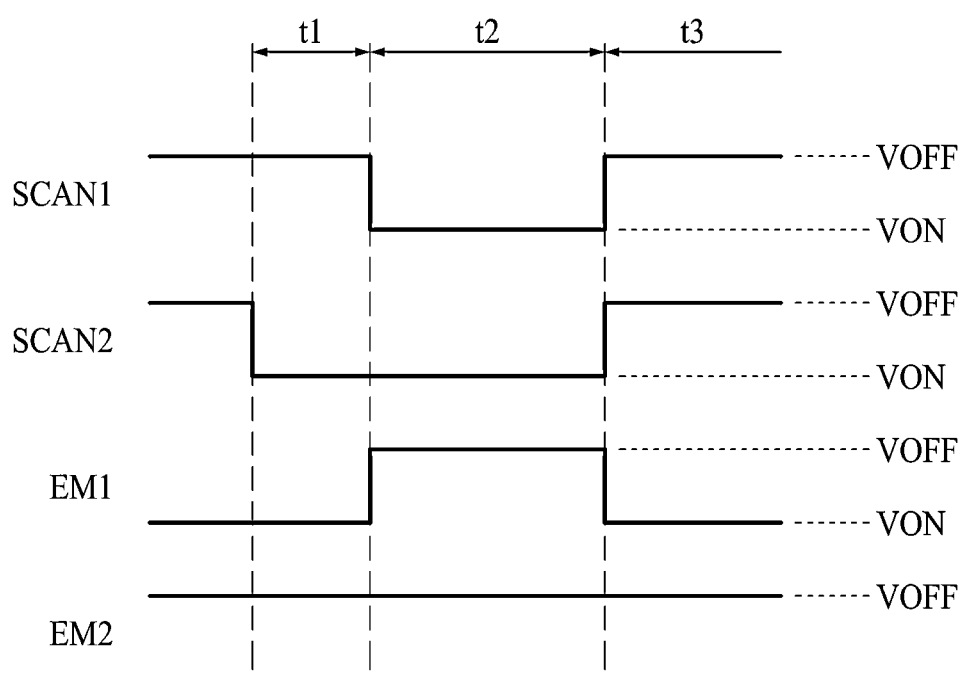
FIG. 7 is an illustration of a driving waveform in a first viewing angle mode of a display panel, according to one example embodiment.
Figure 8:
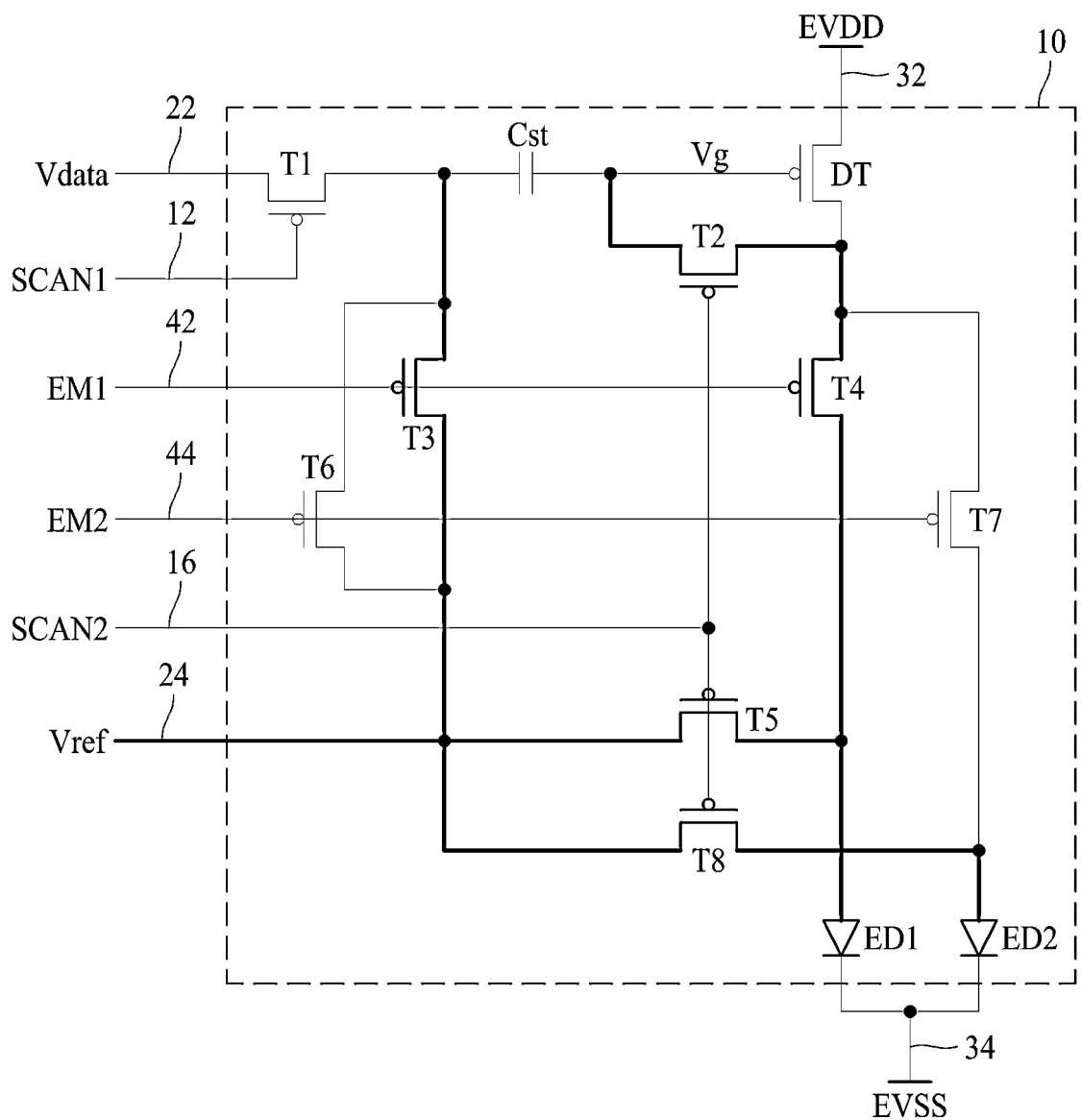
FIG. 8 is a diagram illustrating the operation of a sub-pixel in the first viewing angle mode during an initial period.
Figure 9:
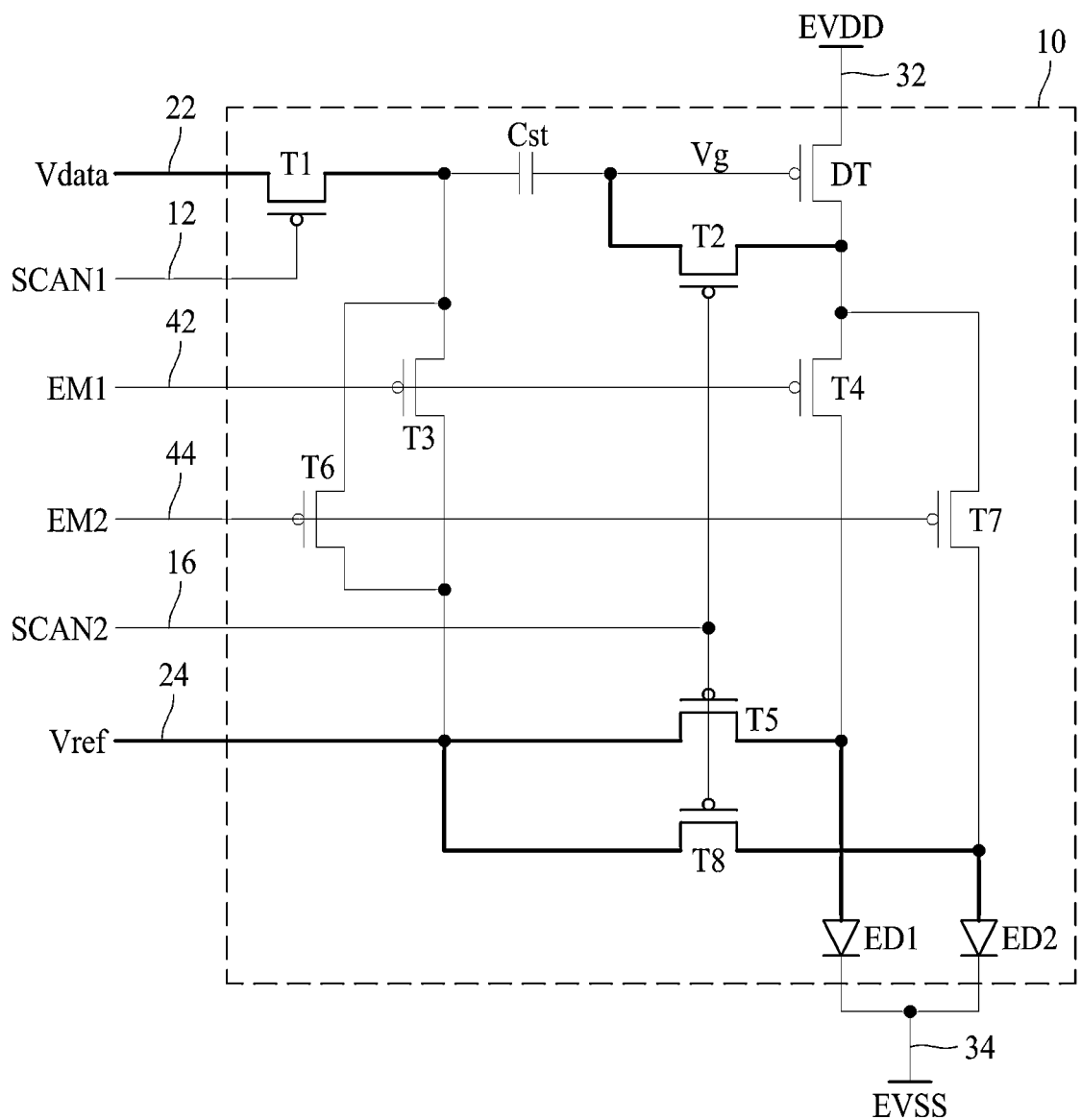
FIG. 9 is a diagram illustrating the operation of a sub-pixel in the first viewing angle mode during a sampling period.
Figure 10:
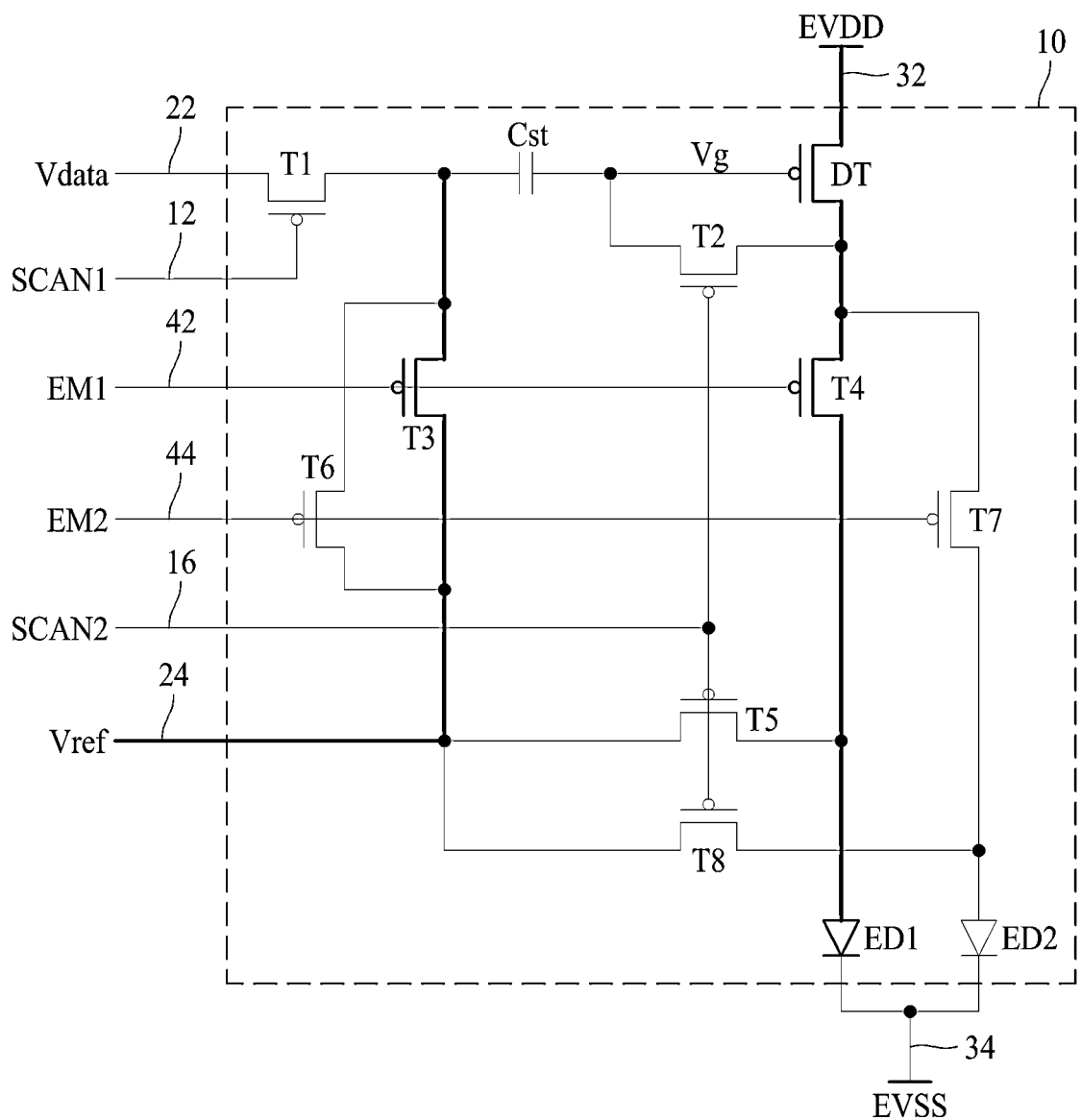
FIG. 10 is a diagram illustrating the operation of a sub-pixel in the first viewing angle mode during an emission period.

FIG. 7 is an illustration of a driving waveform in a first viewing angle mode of a display panel, according to one example embodiment, FIG. 8 is a diagram illustrating the operation of a sub-pixel in the first viewing angle mode during an initial period, FIG. 9 is a diagram illustrating the operation of a sub-pixel in the first viewing angle mode during a sampling period, and FIG. 10 is a diagram illustrating the operation of a sub-pixel in the first viewing angle mode during an emission period.

Referring now to FIGS. 7 to 10, the pixel circuit 10 of each sub-pixel SP can be driven to include an initial period, a sampling and program period, and an emission period for each frame. Each frame can be separated in synchronization with a vertical synchronization signal and include a blank period and an active period.

First, during an initial period in the first viewing angle mode, the wide viewing angle mode, or the share mode, the second scan signal SCAN2 and the first emitting control signal EM1 can be activated by the gate-on-voltage VON, as shown in FIG. 7. The gate-on-voltage VON of the second scan signal SCAN2 and the first emitting control signal EM1 can be a low level.

Further, during the initial period in the first viewing angle mode, the wide viewing angle mode, or the share mode, the first scan signal SCAN1 and the second emitting control signal EM2 can be deactivated by the gate-off-voltage VOFF, as shown in FIG. 7. The gate-off-voltage VOFF of the first scan signal SCAN1 and the second emitting control signal EM2 can be a high level.

The second, fifth, and eighth switching transistors T2, T5, and T8 can be turned on in response to the second scan signal SCAN2, as shown in FIG. 8.

The second switching transistor T2 can connect the gate electrode and the second electrode (or drain electrode) of the driving transistor DT in response to the gate-on-voltage VON of the second scan signal SCAN2.

The fifth switching transistor T5 can supply the initialization voltage Vref (or a reference voltage) supplied through the initialization voltage line 24 to the anode electrode of the first emitting element ED1 in response to the gate-on-voltage VON of the second scan signal SCAN2. The anode electrode of the first emitting element ED1 can be initialized with the initialization voltage Vref (or reference voltage) during the initial period.

The eighth switching transistor T8 can supply the initialization voltage Vref (or reference voltage) supplied through the initialization voltage line 24 to the anode electrode of the second emitting element ED2 in response to the gate-on-voltage VON of the second scan signal SCAN2. The anode electrode of the second emitting element ED2 can be initialized with the initialization voltage Vref (or reference voltage) during the initial period.

The third switching transistor T3 and the first control transistor T4 can be turned on in response to the first emitting control signal EM1, as shown in FIG. 8.

The third switching transistor T3 can supply the initialization voltage Vref (or reference voltage) supplied through the initialization voltage line 24 to the first electrode of the storage capacitor Cst in response to the gate-on-voltage VON of the first emitting control signal EM1.

The first control transistor T4 can deliver the initialization voltage Vref (or reference voltage) supplied via the initialization voltage line 24 to the second electrode of the driving transistor DT in response to the gate-on-voltage VON of the first emitting control signal EM1. The first electrode of the storage capacitor Cst can be supplied with the initialization voltage Vref (or reference voltage) via the first control transistor T4 and the second switching transistor T2. As a result, the first electrode and the second electrode of the storage capacitor Cst can be initialized to the initialization voltage Vref (or reference voltage) during the initial period.

Next, during the sampling period in the first viewing angle mode, the wide viewing angle mode, or the share mode, the first scan signal SCAN1 and the second scan signal SCAN2 can be activated by the gate-on-voltage VON, as shown in FIG. 7. The gate-on-voltage VON of the first scan signal SCAN1 and the second scan signal SCAN2 can be a low level.

Further, during the sampling period in the first viewing angle mode, the wide viewing angle mode, or the share mode, the first emitting control signal EM1 and the second emitting control signal EM2 can be deactivated by the gate-off-voltage VOFF, as shown in FIG. 7. The gate-off-voltage VOFF of the first emitting control signal EM1 and the second emitting control signal EM2 can be a high level.

The first switching transistor T1 can be turned on in response to the first scan signal SCAN1, as shown in FIG. 9. The first switching transistor T1 can supply the data voltage Vdata supplied through the data line 22 to the first electrode of the storage capacitor Cst in response to the gate-on-voltage VON of the first scan signal SCAN1. The first electrode of the storage capacitor Cst can be supplied (writing) with the data voltage Vdata.

The second, fifth, and eighth switching transistors T2, T5, and T8 can be turned on in response to the second scan signal SCAN2 during the initial period and the sampling period, as shown in FIG. 9.

The second switching transistor T2 can charge and compensate the threshold voltage Vth of the driving transistor DT to the second electrode of the storage capacitor Cst during the sampling period. Accordingly, the storage capacitor Cst can be charged the data voltage Vdata+Vth in which the threshold voltage Vth of the driving transistor DT is compensated.

The fifth switching transistor T5 can supply the initialization voltage Vref (or reference voltage) supplied through the initialization voltage line 24 to the anode electrode of the first emitting element ED1 in response to the gate-on-voltage VON of the second scan signal SCAN2 during the initial period and the sampling period.

The eighth switching transistor T8 can supply the initialization voltage Vref (or reference voltage) supplied through the initialization voltage line 24 to the anode electrode of the second emitting element ED2 in response to the gate-on-voltage VON of the second scan signal SCAN2 during the initial period and the sampling period.

Next, during the emission period in the first viewing angle mode, the wide viewing angle mode, or the share mode, the first emitting control signal EM1 can be activated by the gate-on-voltage VON, as shown in FIG. 7. The gate-on-voltage VON of the first emitting control signal EM1 can be a low level.

Further, during the emission period in the first viewing angle mode, the wide viewing angle mode, or the share mode, the first scan signal SCAN1, the second scan signal SCAN2, and the second emitting control signal EM2 can be deactivated by the gate-off-voltage VOFF, as shown in FIG. 7. The gate-off-voltage VOFF of the first scan signal SCAN1, the second scan signal SCAN2, and the second emitting control signal EM2 can be a high level.

The third switching transistor T3 and the first control transistor T4 can be turned on in response to the first emitting control signal EM1, as shown in FIG. 10.

The third switching transistor T3 can supply the initialization voltage Vref (or reference voltage) supplied through the initialization voltage line 24 to the first electrode of the storage capacitor Cst in response to the gate-on-voltage VON of the first emitting control signal EM1. Accordingly, the first electrode of the storage capacitor Cst can be changed to the initialization voltage Vref (or reference voltage).

The first control transistor T4 can connect the first emitting element ED1 and the second electrode of the driving transistor DT in response to the gate-on-voltage VON of the first emitting control signal EM1. The first emitting element ED1 can be driven by the driving current from the driving transistor DT to emit light. Accordingly, the sub-pixels SP1, SP2, and SP3 can emit light at the first viewing angle through the first lens LZ1, and can operate in the first viewing angle mode, the wide viewing angle mode, or the share mode.

Figure 11:
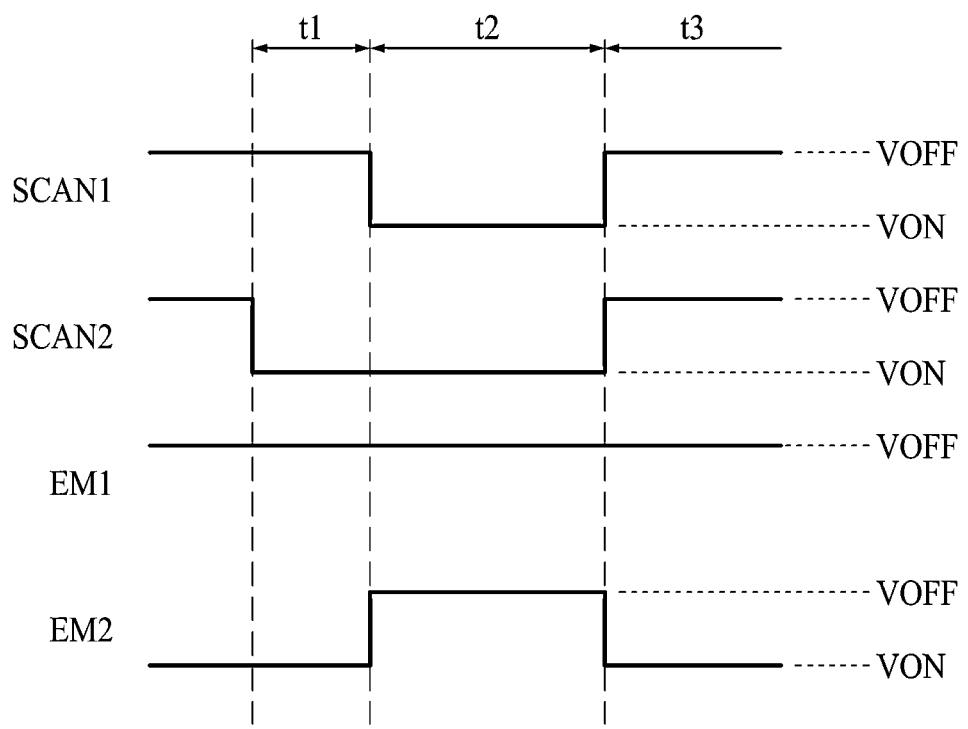
FIG. 11 is an illustration of a driving waveform in a second viewing angle mode of a display panel, according to one example embodiment.
Figure 12:
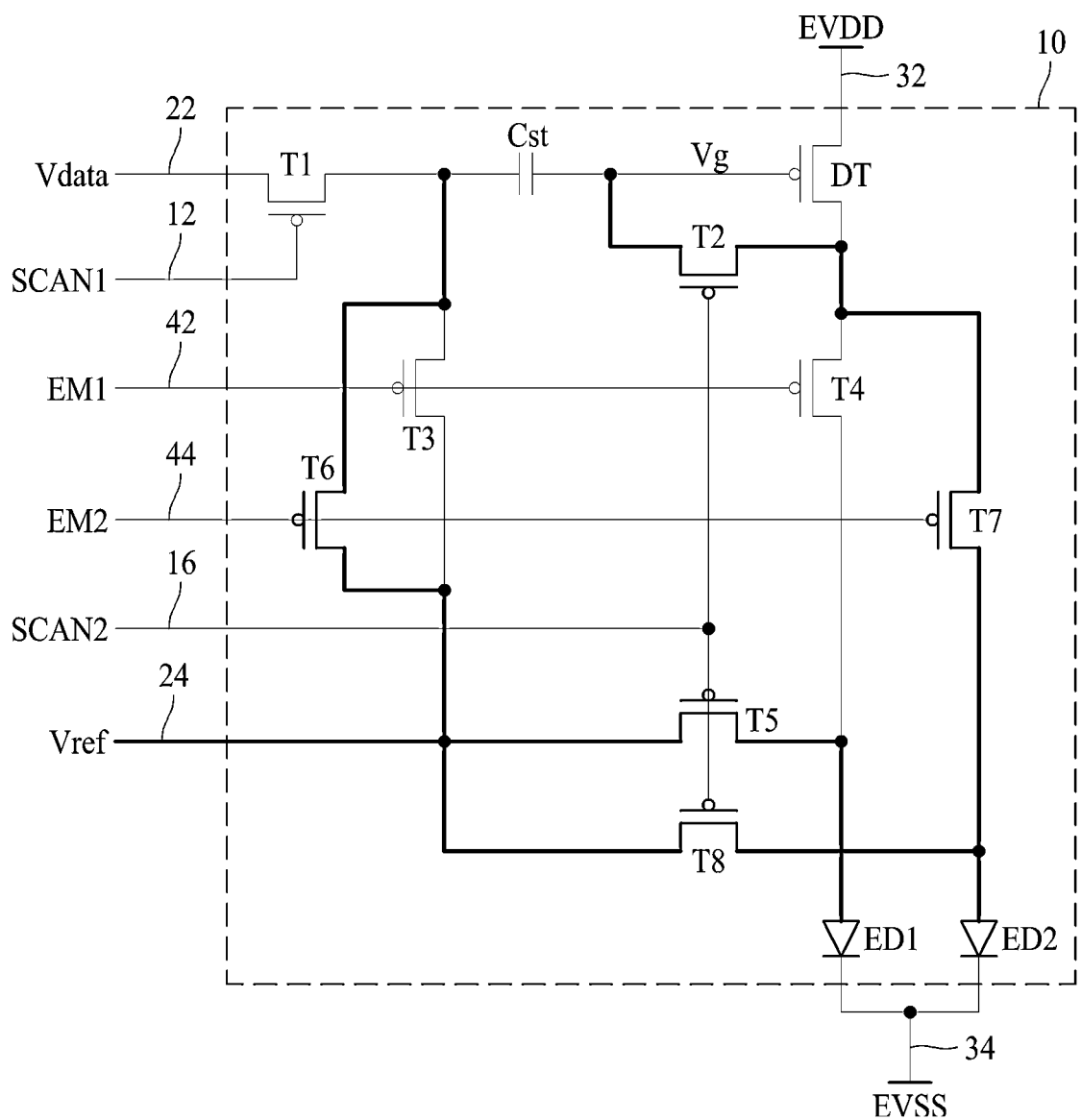
FIG. 12 is a diagram illustrating the operation of a sub-pixel in the second viewing angle mode during an initial period.
Figure 13:
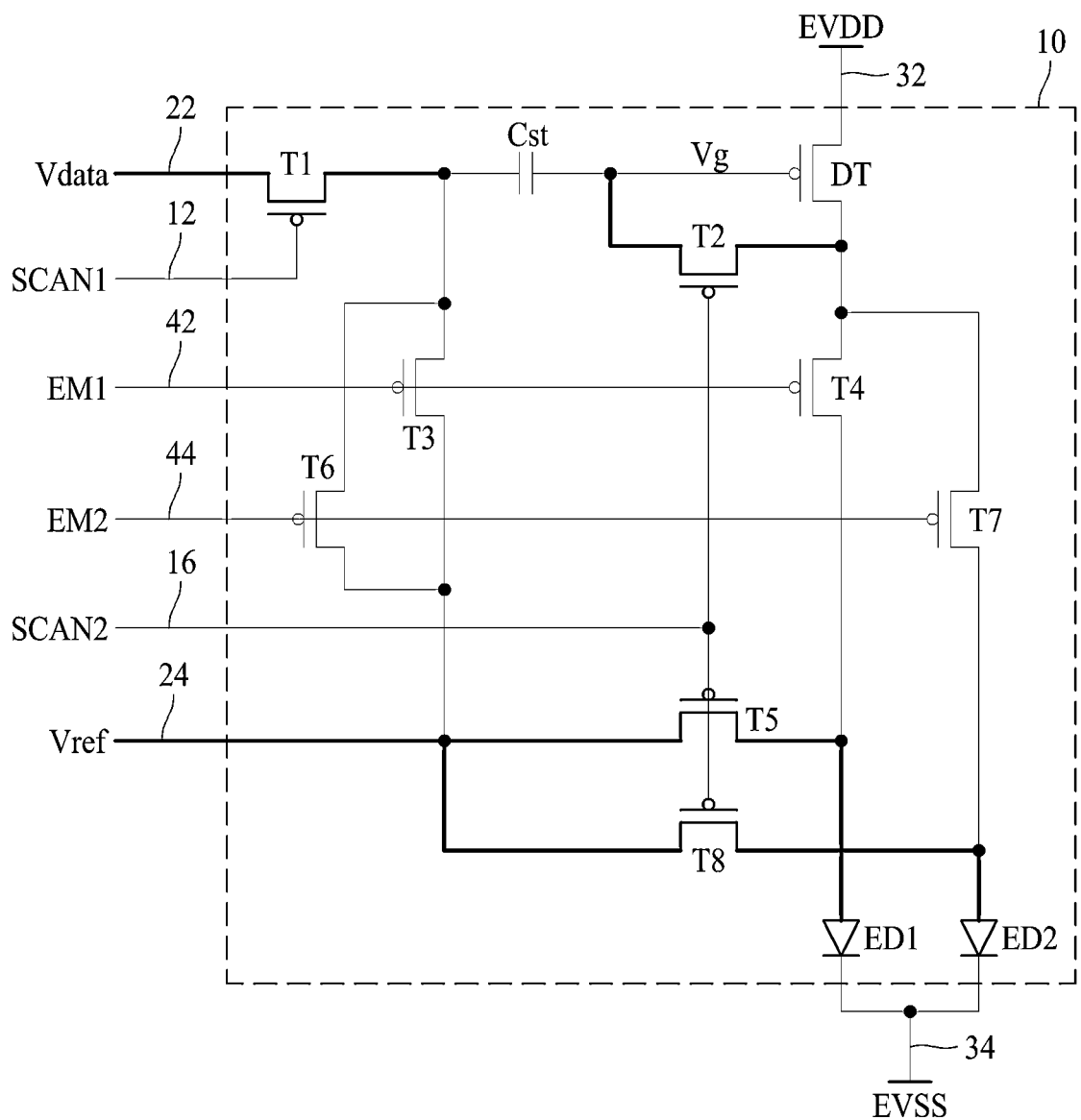
FIG. 13 is a diagram illustrating the operation of a sub-pixel in the second viewing angle mode during a sampling period.
Figure 14:
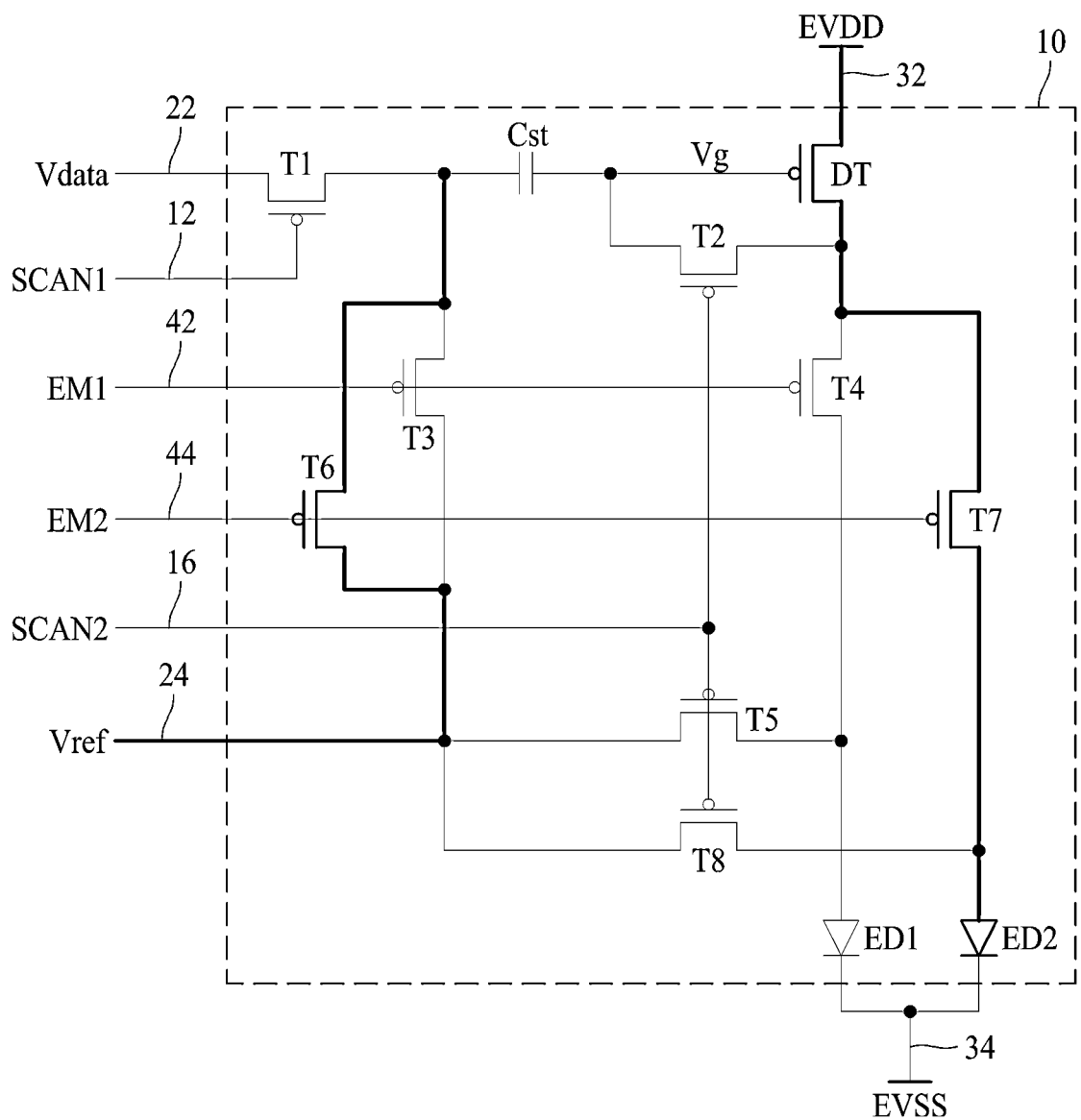
FIG. 14 is a diagram illustrating the operation of a sub-pixel in the second viewing angle mode during an emission period.

FIG. 11 is an illustration of a driving waveform in a second viewing angle mode of a display panel, according to one example embodiment, FIG. 12 is a diagram illustrating the operation of a sub-pixel in the second viewing angle mode during an initial period, FIG. 13 is a diagram illustrating the operation of a sub-pixel in the second viewing angle mode during a sampling period, and FIG. 14 is a diagram illustrating the operation of a sub-pixel in the second viewing angle mode during an emission period.

Referring to FIGS. 11 to 14, first, during the initial period in the second viewing angle mode, the narrow viewing angle mode, or the privacy mode, the second scanning signal SCAN2 and the second emitting control signal EM2 can be activated by the gate-on-voltage VON, as shown in FIG. 11. The gate-on-voltage VON of the second scan signal SCAN2 and the second emitting control signal EM2 can be a low level.

Further, during the initial period in the second viewing angle mode, the narrow viewing angle mode, or the privacy mode, the first scan signal SCAN1 and the first emitting control signal EM1 can be deactivated by the gate-off-voltage VOFF, as shown in FIG. 11. The gate-off-voltage VOFF of the first scan signal SCAN1 and the first emitting control signal EM1 can be a high level.

The second, fifth, and eighth switching transistors T2, T5, and T8 can be turned on in response to the second scan signal SCAN2, as shown in FIG. 12.

The second switching transistor T2 can connect the gate electrode and the second electrode (or drain electrode) of the driving transistor DT in response to the gate-on-voltage VON of the second scan signal SCAN2.

The fifth switching transistor T5 can supply the initialization voltage Vref (or a reference voltage) supplied through the initialization voltage line 24 to the anode electrode of the first emitting element ED1 in response to the gate-on-voltage VON of the second scan signal SCAN2. The anode electrode of the first emitting element ED1 can be initialized with the initialization voltage Vref (or reference voltage) during the initial period.

The eighth switching transistor T8 can supply the initialization voltage Vref (or reference voltage) supplied through the initialization voltage line 24 to the anode electrode of the second emitting element ED2 in response to the gate-on-voltage VON of the second scan signal SCAN2. The anode electrode of the second emitting element ED2 can be initialized with the initialization voltage Vref (or reference voltage) during the initial period.

The sixth switching transistor T6 and the second control transistor T7 can be turned on in response to the second emitting control signal EM2, as shown in FIG. 12.

The sixth switching transistor T6 can supply the initialization voltage Vref (or reference voltage) supplied through the initialization voltage line 24 to the first electrode of the storage capacitor Cst in response to the gate-on-voltage VON of the second emitting control signal EM2.

The second control transistor T7 can supply the initialization voltage Vref (or reference voltage) supplied through the initialization voltage line 24 to the second electrode of the driving transistor DT in response to the gate-on-voltage VON of the second emitting control signal EM2. The first electrode of the storage capacitor Cst can be supplied with the initialization voltage Vref (or reference voltage) through the second control transistor T7 and the second switching transistor T2. As a result, the first electrode and the second electrode of the storage capacitor Cst can be initialized to the initialization voltage Vref (or reference voltage) during the initial period.

Next, during the sampling period in the second viewing angle mode, the narrow viewing angle mode, or the privacy mode, the first scan signal SCAN1 and the second scan signal SCAN2 can be activated by the gate-on-voltage VON, as shown in FIG. 11. The gate-on-voltage VON of the first scan signal SCAN1 and the second scan signal SCAN2 can be at a low level.

Further, during the sampling period in the second viewing angle mode, the narrow viewing angle mode, or the privacy mode, the first emitting control signal EM1 and the second emitting control signal EM2 can be deactivated by the gate-off-voltage VOFF, as shown in FIG. 11. The gate-off-voltage VOFF of the first emitting control signal EM1 and the second emitting control signal EM2 can be a high level.

The first switching transistor T1 can be turned on in response to the first scan signal SCAN1, as shown in FIG. 13. The first switching transistor T1 can supply the data voltage Vdata supplied through the data line 22 to the first electrode of the storage capacitor Cst in response to the gate-on-voltage VON of the first scan signal SCAN1. The first electrode of the storage capacitor Cst can be supplied (writing) with the data voltage Vdata.

The second, fifth, and eighth switching transistors T2, T5, and T8 can be turned on in response to the second scan signal SCAN2 during the initial period and the sampling period, as shown in FIG. 13.

The second switching transistor T2 can charge and compensate the threshold voltage Vth of the driving transistor DT to the second electrode of the storage capacitor Cst during the sampling period. Accordingly, the storage capacitor Cst can be charged the data voltage Vdata+Vth in which the threshold voltage Vth of the driving transistor DT is compensated.

The fifth switching transistor T5 can supply the initialization voltage Vref (or reference voltage) supplied through the initialization voltage line 24 to the anode electrode of the first emitting element ED1 in response to the gate-on-voltage VON of the second scan signal SCAN2 during the initial period and the sampling period.

The eighth switching transistor T8 can supply an initialization voltage Vref (or reference voltage) supplied through the initialization voltage line 24 to the anode electrode of the second emitting element ED2 in response to the gate-on-voltage VON of the second scan signal SCAN2 during the initial period and the sampling period.

Next, during the emission period in the second viewing angle mode, the narrow viewing angle mode, or the privacy mode, the second emitting control signal EM2 can be activated by the gate-on-voltage VON, as shown in FIG. 11. The gate-on-voltage VON of the second emitting control signal EM2 can be a low level.

Further, during the emission period in the second viewing angle mode, the narrow viewing angle mode, or the privacy mode, the first scan signal SCAN1, the second scan signal SCAN2, and the first emitting control signal EM1 can be deactivated by the gate-off-voltage VOFF, as shown in FIG. 11. The gate-off-voltage VOFF of the first scan signal SCAN1, the second scan signal SCAN2, and the first emitting control signal EM1 can be a high level.

The sixth switching transistor T6 and the second control transistor T7 can be turned on in response to the second emitting control signal EM2, as shown in FIG. 14.

The sixth switching transistor T6 can supply the initialization voltage Vref (or reference voltage) supplied through the initialization voltage line 24 to the first electrode of the storage capacitor Cst in response to the gate-on-voltage VON of the second emitting control signal EM2. Accordingly, the first electrode of the storage capacitor Cst can be changed to the initialization voltage Vref (or reference voltage).

The second control transistor T7 can connect the second electrode of the driving transistor DT and the second emitting element ED2 in response to the gate-on-voltage VON of the second emitting control signal EM2. The second emitting element ED2 can be driven by the driving current from the driving transistor DT to emit light. Accordingly, the sub-pixels SP1, SP2, and SP3 can emit light at the second viewing angle through the second lens LZ2, and can operate in the second viewing angle mode, the narrow viewing angle mode, or the privacy mode.

As described above, the display panel 110 according to one example embodiment can utilize only two emitting control signals EM1 and EM2 to select the viewing angle mode of each sub-pixel SP1, SP2, and SP3 between the first viewing angle mode and the second viewing angle mode.

Specifically, the display panel 110 according to one example embodiment can supply the first emitting control signal EM1 to each of the sub-pixels SP1, SP2, and SP3 through the first emitting control line 42 to select the first viewing angle mode. At this time, the first emitting control line 42 can be connected to the first control transistor T4 that controls the emission of the first emitting element ED1 between the driving transistor DT and the first emitting element ED1 and the third switching transistor T3 that supplies the initialization voltage Vref (or a reference voltage) to the storage capacitor Cst for emitting the first emitting element ED1. The first emitting element ED1 can be connected to the driving transistor DT to emit when the first control transistor T4 and the third switching transistor T3 are turned on by the first emitting control signal EM1 supplied through the first emitting control line 42.

On the other hand, the display panel 110 according to one example embodiment can supply the second emitting control signal EM2 to each of the sub-pixels SP1, SP2, and SP3 through the second emitting control line 44 to select the second viewing angle mode. At this time, the second emitting control line 44 can be connected to the second control transistor T7 that controls the emission of the second emitting element ED2 between the driving transistor DT and the second emitting element ED2 and the sixth switching transistor T6 that supplies the initialization voltage Vref (or a reference voltage) to the storage capacitor Cst for emitting the second emitting element ED2. The second emitting element ED2 can be connected to the driving transistor DT to emit when the second control transistor T7 and the sixth switching transistor T6 are turned on by the second emitting control signal EM2 supplied through the second emitting control line 44.

As such, the display panel 110 according to one example embodiment can utilize a minimal number of signal lines to control the viewing angle mode of each sub-pixel SP. For example, the display panel 110 according to one example embodiment can utilize two emitting control lines 42 and 44 to control the viewing angle mode of each sub-pixel SP. The display panel 110 according to one example embodiment can have a reduced number of emitting control lines disposed in the display panel 110 when compared to a display panel separately having an emitting control line for supplying an initialization voltage Vref (or reference voltage) to the storage capacitor Cst in addition to an emitting control line for controlling the emission of the first emitting element ED1, an emitting control line for controlling the emission of the second emitting element ED2. The display panel 110 according to one example embodiment can reduce production energy, reduce generation of greenhouse gases by reducing the number of signal lines formed within the display panel 110, thus implement ESG (Environment/Social/Governance).

Figure 15:
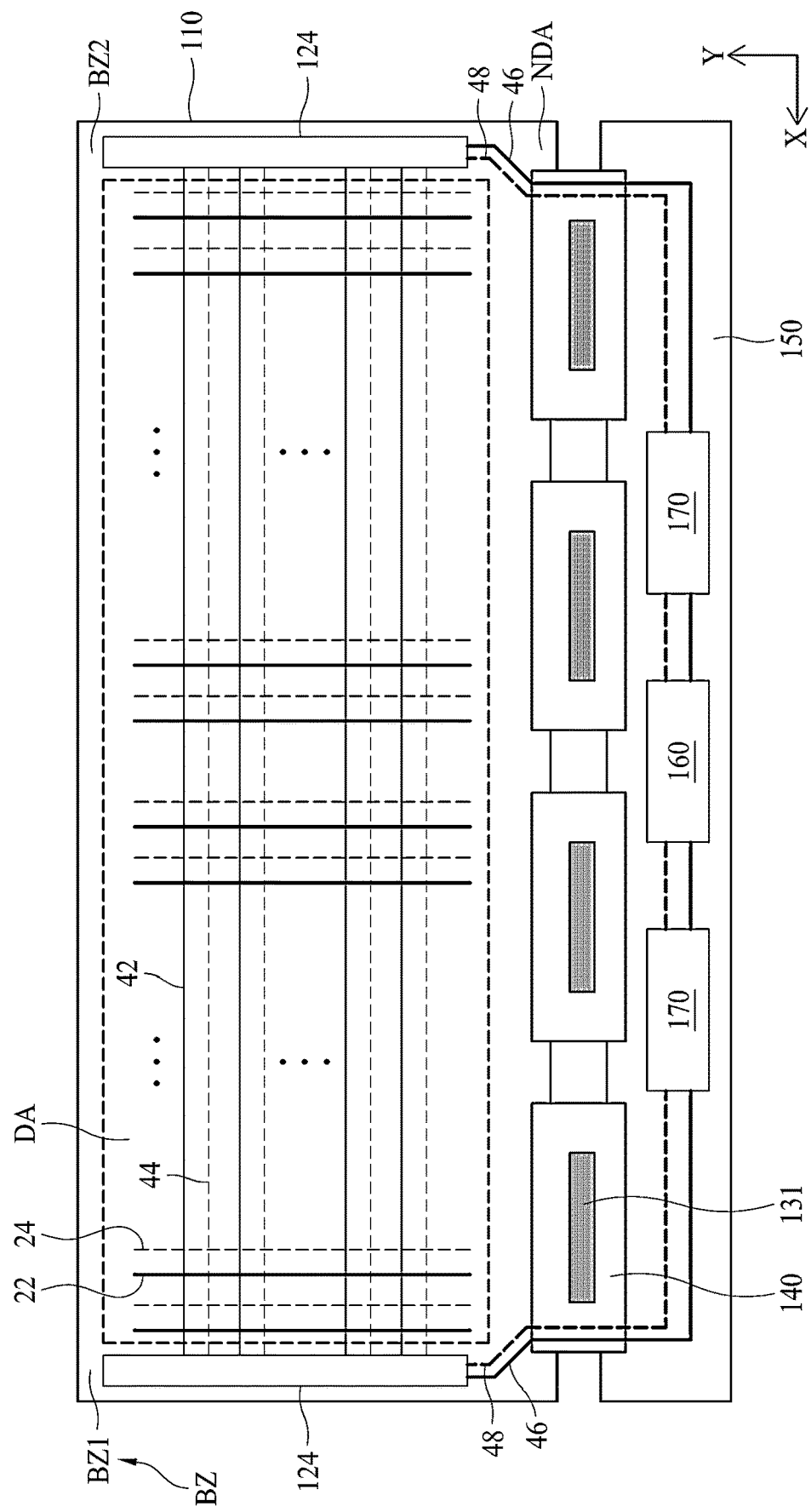
FIG. 15 is a diagram illustrating an example of a connection relationship between emitting control lines and sub-pixels provided in a display area.
Figure 16:
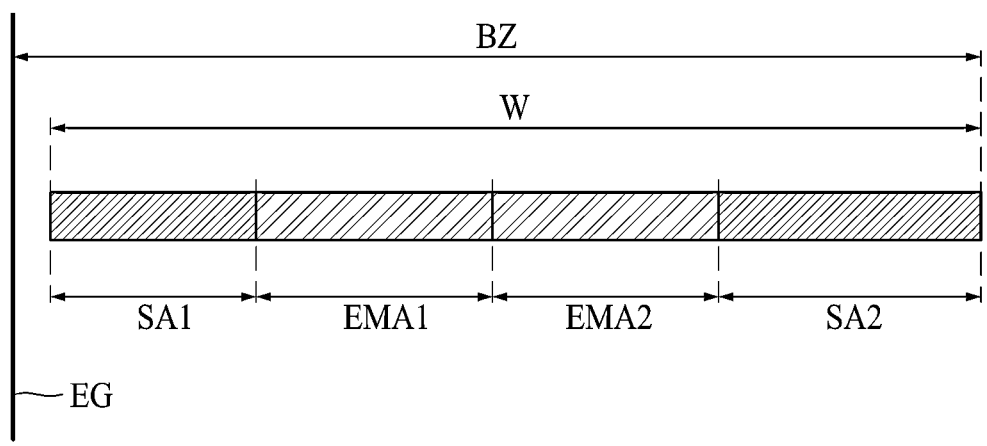
FIG. 16 is a drawing illustrating an example of a gate driver, according to one example embodiment.

FIG. 15 is a diagram illustrating an example of a connection relationship between emitting control lines and sub-pixels provided in a display area, and FIG. 16 is a drawing illustrating an example of a gate driver, according to one example embodiment.

Referring to FIGS. 15 and 16, the display panel 110 according to one example embodiment can be connected to a plurality of circuit films 140 on which each of a plurality of data drive ICs 131 is mounted. The plurality of circuit films 140 can be disposed in a row in the first direction (e.g., in the X-axis direction) and can be bonded to the pad area provided in the non-display area NDA of the display panel 110. The plurality of circuit films 140 can be bonded to pad areas provided on a printed circuit substrate 150 on which the timing controller 160 is mounted.

The display panel 110 according to one example embodiment can be provided with emitting control lines 42 and 44 in the display area DA as shown in FIG. 15. The emitting control lines 42 and 44 can extend in the first direction (e.g., the X-axis direction) and can supply emitting control signals EM1 and EM2 to sub-pixels SP disposed in the first direction (e.g., the X-axis direction). The emitting control lines 42 and 44 can be arranged as two first emitting control lines 42 and two second emitting control lines 44 for each row line.

The first emitting control line 42 and the second emitting control line 44 disposed in each row line can be connected to the emitting control driver 124 in the bezel area BZ. For example, the emitting control driver 124 can be disposed in any of the first and second bezel areas BZ1 and BZ2 facing with the display area DA interposed therebetween, or can be disposed on both sides of the first and second bezel areas BZ1 and BZ2, as shown in FIG. 15. The first emitting control line 42 and the second emitting control line 44 can be connected with the emitting control driver 124 in any of the first and second bezel areas BZ1 and BZ2, or on both sides of the first and second bezel areas BZ1 and BZ2.

The emitting control driver 124 can supply emitting control signals to each of the plurality of row lines using gate control signals supplied from the timing controller 160 or the level shifter 170 shown in FIG. 2. The emitting control driver 124 can be supplied with a first gate control signal through the first gate control signal line 46 from the timing controller 160 or the level shifter 170 shown in FIG. 2, and can supply the first emitting control signal EM1 to the first emitting control lines 42 disposed in each of the plurality of row lines using the first gate control signal. Further, the emitting control driver 124 shown in FIG. 2, can be supplied with a second gate control signal through the second gate control signal line 48 from the timing controller 160 or the level shifter 170 shown in FIG. 2, and can supply the second emitting control signal EM2 to the second emitting control lines 44 disposed in each of the plurality of row lines using the second gate control signal.

In one example embodiment, the emitting control signals for each of the first emitting control line 42 and the second emitting control line 44 can be generated using gate control signals supplied from the timing controller 160 through the printed circuit substrate 150 and the circuit film 140, as shown in FIG. 15. However, it is not necessarily limited thereto.

The emitting control driver 124 can supply emitting control signals to the first and second emitting control lines 42, 44 connected to the sub-pixels SPs of each row line. Accordingly, the display panel 110 can control the viewing angle of the plurality of sub-pixels SPs provided in the display area DA.

For example, the first emitting control line 42 can be supplied with a gate-on-voltage VON as the first emitting control signal. At this time, the second emitting control line 44 can be supplied with a gate-off-voltage VOFF as the second emitting control signal. The plurality of sub-pixels SP can cause the first emitting element to emit through the first control transistor in response to the first emitting control signal. The light emitted from the first emitting element can emit at the first viewing angle. Accordingly, the display area DA can display an image in the first viewing angle mode.

The second emitting control line 44 can be supplied with the gate-on-voltage VON as the second emitting control signal EM2. At this time, the first emitting control line 42 can be supplied with the gate-off-voltage VOFF by the first emitting control signal EM1. The plurality of sub-pixels SP can cause the second emitting element to emit through the second control transistor in response to the second emitting control signal. The light emitted from the second emitting element can emit at the second viewing angle. Accordingly, the display area DA can display an image in the second viewing angle mode.

The display device 100 according to one example embodiment can utilize only two emitting control signals to control the viewing angle mode of the sub-pixels (BSPs) included within the display area DA. The display device 100 according to one example embodiment can utilize only a minimal number of signal lines to control the viewing angle mode of each sub-pixel SP. For example, the display panel 110 according to one example embodiment can have a reduced number of emitting control lines disposed in the display panel 110 compared to a display panel separately having the emitting control line for supplying an initialization voltage (or reference voltage) to the storage capacitor Cst in addition to an emitting control line for controlling the emission of the first emitting element and an emitting control line for controlling the emission of the second emitting element.

The display panel 110 according to one example embodiment can reduce production energy, reduce the generation of greenhouse gases, by reducing the number of emitting control lines formed within the display panel 110, thus implement ESG (Environment/Social/Governance).

Further, the display device 100 according to one example embodiment can reduce the area formed by the emitting control driver 124 that supplies the emitting control signals to the emitting control lines 42 and 44 within the bezel area BZ as the number of emitting control lines 42 and 44 is reduced.

Referring to FIG. 16, the display device 100 according to one example embodiment can be provided with a gate driver 120 shown in FIG. 2, including a scan driver 122 shown in FIG. 2, and an emitting control driver 124 shown in FIG. 2, in a bezel area BZ. The width of the bezel area BZ is affected by the width of the area in which the scan driver 122 shown in FIG. 2, and the emitting control driver 124 shown in FIG. 2, are formed.

In one example, the scan driver 122 shown in FIG. 2, of the display device 100 can include a first scan driver connected to the first scan line to supply a first scan signal and a second scan driver connected to the second scan line to supply a second scan signal. The emitting control driver 124 shown in FIG. 2, of the display device 100 can include a first emitting control driver supplying the first emitting control signal to the first emitting control line 42 and a second emitting control driver supplying the second emitting control signal to the second emitting control line 44.

The bezel area BZ of the display device 100 according to one example embodiment can include a first scan area SA1 in which a first scan driver is formed, a first emitting control area EMA1 in which a first emitting control driver is formed, a second emitting control area EMA2 in which a second scan driver is formed, and a second scan area SA2 in which a second scan driver is formed.

The bezel area BZ is not able to have a width W smaller than the sum of each width of the first scan area SA1, the first emission control area EMA1, the second emission control area EMA2, and the second scan area SA2. In other words, the smaller the sum of each width of the first scan area SA1, the first emission control area EMA1, the second emission control area EMA2, and the second scan area SA2 is, the smaller the width of the bezel area BZ is able to be.

Since the display device 100 according to one example embodiment utilizes two emitting control signals, two emitting control drivers corresponding to each of the two emitting control signals can be formed in the bezel area BZ. Even though the display device 100 according to one example embodiment has a pixel circuit capable of controlling the viewing angle mode of each sub-pixel SP, the number of signal lines formed in the display area DA does not increase significantly, and the number of emitting control drivers formed in the bezel area BZ increases less. By minimizing the number of emitting control drivers formed in the bezel area BZ, the display device 100 according to one example embodiment can minimize the width of the bezel area BZ. That is, the display device 100 according to one example embodiment can implement a narrow bezel.

Example embodiments of the present disclosure have been described in more detail with reference to the accompanying drawings, but the present disclosure is not necessarily limited to these example embodiments and can be practiced in various modifications without departing from the technical ideas of the present disclosure. Accordingly, the example embodiments disclosed herein are intended to illustrate and not to limit the technical ideas of the present disclosure, and the scope of the technical ideas of the present disclosure is not limited by these example embodiments. Therefore, the example embodiments described above are examples in all respects and should be understood as non-limiting. The scope of protection of this specification shall be construed by the claims, and all technical ideas within the scope of the claims shall be construed to be included within the scope of the claims.

In one or more aspects of the present disclosure, only two emitting control signals can be utilized to control the viewing angle mode of the sub-pixel, thereby reducing the number of emitting control lines disposed on the display panel.

In addition, one or more aspects of the present disclosure can reduce production energy and reduce the generation of greenhouse gases, by reducing the number of signal lines formed within the display panel, thus implement ESG (Environment/Social/Governance).

Further, one or more aspects of the present disclosure can minimize the number of emitting control drivers formed in the bezel area despite having a pixel circuit capable of controlling the viewing angle mode of the sub-pixels. The present disclosure can minimize a width of the bezel area.

The effects to be obtained from the present disclosure are not limited to those mentioned above, and other effects not mentioned will be apparent to one having ordinary skill in the art to which the present invention belongs from the present disclosure.

What is claimed is:

1. A display device, comprising:
a display panel having a non-display area and a display area provided with a plurality of sub-pixels,
wherein each of the plurality of sub-pixels comprises:
a first mode sub-pixel having a first viewing angle and including a first emitting element;
a second mode sub-pixel having a second viewing angle and including a second emitting element;
a driving transistor connected to the first emitting element or the second emitting element;
a first emitting control line configured to supply a first emitting control signal;
a second emitting control line configured to supply a second emitting control signal;
a first switching transistor configured to supply a reference voltage to a storage capacitor according to the first emitting control signal;
a second switching transistor configured to supply the reference voltage to the storage capacitor according to the second emitting control signal;
a first control transistor configured to connect the first emitting element and the driving transistor according to the first emitting control signal; and
a second control transistor configured to connect the second emitting element and the driving transistor according to the second emitting control signal.

2. The display device of claim 1, wherein the first switching transistor and the first control transistor are configured to be applied with the first emitting control signal from the same first emitting control line.

3. The display device of claim 1, wherein the second switching transistor and the second control transistor are configured to be applied with the second emitting control signal from the same second emitting control line.

4. The display device of claim 1,
wherein the first switching transistor and the first control transistor are configured to turn on in response to the first emitting control signal corresponding to a gate-on-voltage being supplied to the first emitting control line, and
wherein the second switching transistor and the second control transistor are configured to turn on in response to the second emitting control signal corresponding to the gate-on-voltage being supplied to the second emitting control line.

5. The display device of claim 4, wherein the gate-on-voltage is for being selectively supplied to any one of the first emitting control line and the second emitting control line.

6. The display device of claim 5,
wherein a gate-off-voltage is for being supplied to the second emitting control line in response to the gate-on-voltage being supplied to the first emitting control line, and
wherein the gate-off-voltage is for being supplied to the first emitting control line in response to the gate-on-voltage being supplied to the second emitting control line.

7. The display device of claim 1, wherein the first viewing angle and the second viewing angle are different in at least one of a direction and an angular range.

8. The display device of claim 1, wherein the second mode sub-pixel is disposed adjacent to the first mode sub-pixel.

9. The display device of claim 1,
wherein each of the plurality of sub-pixels is configured to be driven to include an initial period, a sampling period, and an emission period for each frame, and
wherein each of the plurality of sub-pixels is configured to apply the first emitting control signal corresponding to a gate-on-voltage to the first switching transistor and the first control transistor through the first emitting control line during the emission period, and the first switching transistor and the first control transistor is configured to be turned on to drive the first emitting element.

10. The display device of claim 1,
wherein each of the plurality of sub-pixels is configured to be driven to include an initial period, a sampling period, and an emission period for each frame, and
wherein each of the plurality of sub-pixels is configured to apply the second emitting control signal corresponding to a gate-on-voltage to the second switching transistor and the second control transistor through the second emitting control line during the emission period, and the second switching transistor and the second control transistor are configured to be turned on to drive the second emitting element.

11. The display device of claim 1, wherein the storage capacitor is configured to be supplied with the reference voltage from any one of the first switching transistor and the second switching transistor according to a viewing angle mode.

12. The display device of claim 1,
wherein the display panel comprises:
a first emitting control driver disposed in the non-display area and configured to supply the first emitting control signal to the first emitting control line; and
a second emitting control driver disposed to one side of the first emitting control driver in the non-display area and configured to supply the second emitting control signal to the second emitting control line.

* * * * *